(12) United States Patent
Aketa

(10) Patent No.: US 9,685,503 B2
(45) Date of Patent: Jun. 20, 2017

(54) SEMICONDUCTOR DEVICE

(71) Applicant: ROHM CO., LTD., Kyoto (JP)

(72) Inventor: Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/988,636

(22) Filed: Jan. 5, 2016

(65) Prior Publication Data

US 2016/0181356 A1  Jun. 23, 2016

Related U.S. Application Data

(63) Continuation of application No. 14/158,381, filed on Jan. 17, 2014, now Pat. No. 9,252,210, which is a continuation of application No. 13/441,202, filed on Apr. 6, 2012, now Pat. No. 8,633,560.

(30) Foreign Application Priority Data

Apr. 6, 2011 (JP) .................................. 2011-084715
Jun. 28, 2011 (JP) .................................. 2011-143179

(51) Int. Cl.
| | |
|---|---|
| *H01L 29/16* | (2006.01) |
| *H01L 29/06* | (2006.01) |
| *H01L 29/66* | (2006.01) |
| *H01L 29/872* | (2006.01) |
| *H01L 29/10* | (2006.01) |

(Continued)

(52) U.S. Cl.
CPC ...... *H01L 29/0619* (2013.01); *H01L 29/1095* (2013.01); *H01L 29/1602* (2013.01); *H01L 29/1608* (2013.01); *H01L 29/2003* (2013.01); *H01L 29/6606* (2013.01); *H01L 29/872* (2013.01); *H01L 29/47* (2013.01); *Y02B 10/30* (2013.01)

(58) Field of Classification Search
CPC ................. H01L 29/45; H01L 27/0766; H01L 29/66257; H01L 29/66848; H01L 33/0033; H01L 29/0619; H01L 29/872; H01L 29/1095; H01L 29/1602; H01L 29/1608; H01L 29/2003; H01L 29/6606
USPC ..... 257/471, 77, 653; 438/92, 167, 534, 570
See application file for complete search history.

(56) References Cited

U.S. PATENT DOCUMENTS

| | | | | |
|---|---|---|---|---|
| 8,026,558 | B2 * | 9/2011 | Grebs ................. | H01L 29/0653 257/332 |
| 8,154,073 | B2 * | 4/2012 | Aoki ................... | H01L 29/0696 257/330 |

(Continued)

FOREIGN PATENT DOCUMENTS

| | | |
|---|---|---|
| JP | 2005-079339 A | 3/2005 |
| JP | 2011-009797 A | 1/2011 |

*Primary Examiner* — Jarrett Stark
*Assistant Examiner* — Shahed Ahmed
(74) *Attorney, Agent, or Firm* — Rabin & Berdo, P.C.

(57) ABSTRACT

A semiconductor device includes a first conductivity type semiconductor layer that includes a wide bandgap semiconductor and a surface. A trench, including a side wall and a bottom wall, is formed in the semiconductor layer surface, and a Schottky electrode is connected to the surface. Opposite edge portions of the bottom wall of the trench each include a radius of curvature, R, satisfying the expression $0.01\ L < R < 10\ L$, where L represents the straight-line distance in a width direction of the trench between the opposite edge portions.

16 Claims, 23 Drawing Sheets

(51) Int. Cl.
*H01L 29/20* (2006.01)
*H01L 29/47* (2006.01)

(56) References Cited

U.S. PATENT DOCUMENTS

| | | | | |
|---|---|---|---|---|
| 8,222,649 | B2* | 7/2012 | Miura | H01L 29/0615 257/134 |
| 2002/0125541 | A1* | 9/2002 | Korec | H01L 27/0817 257/471 |
| 2005/0029557 | A1 | 2/2005 | Hatakeyama et al. | |
| 2006/0076639 | A1* | 4/2006 | Lypen | H01L 29/0692 257/471 |
| 2006/0255407 | A1* | 11/2006 | Ishida | H01L 23/3171 257/347 |
| 2009/0218619 | A1* | 9/2009 | Hebert | H01L 29/0619 257/332 |
| 2009/0253234 | A1* | 10/2009 | Lee | H01L 29/0878 438/151 |
| 2012/0309208 | A1* | 12/2012 | Tanida | H01L 21/268 438/795 |
| 2012/0313212 | A1* | 12/2012 | Sugawara | H01L 29/0615 257/471 |

* cited by examiner

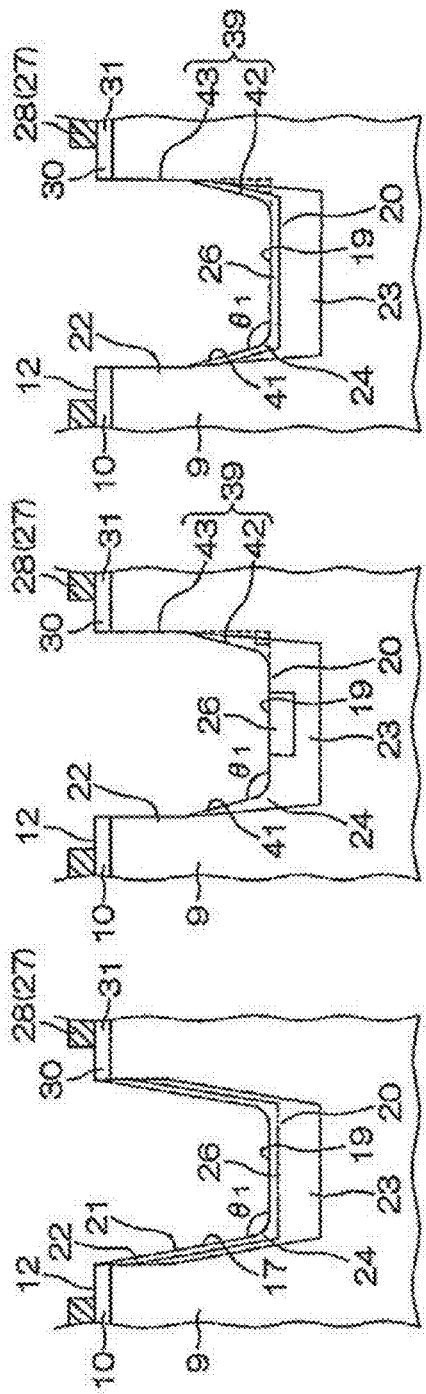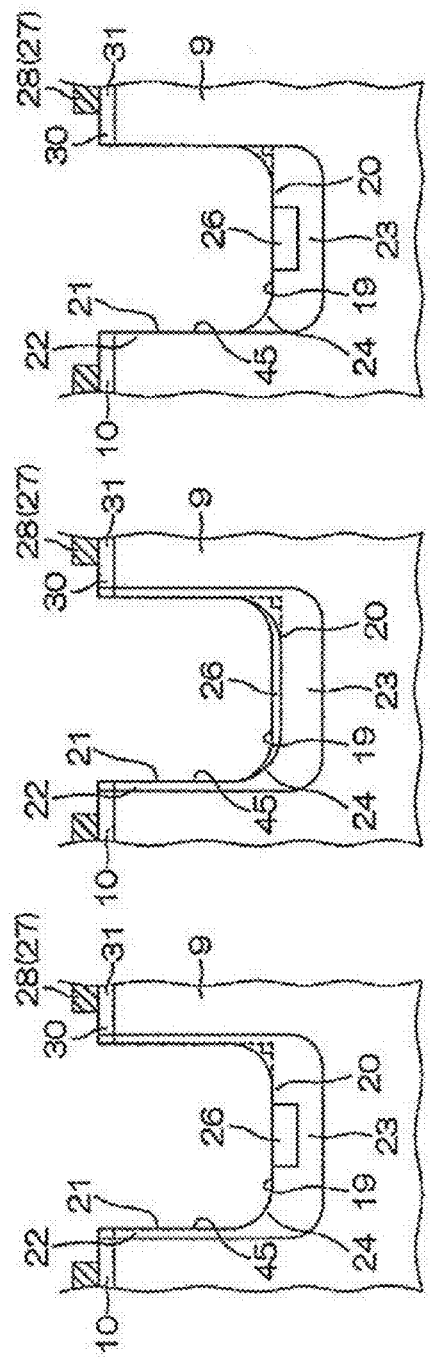
FIG. 16A  FIG. 16B  FIG. 16C
FIG. 16D  FIG. 16E  FIG. 16F

SEMICONDUCTOR DEVICE

CROSS-REFERENCE TO RELATED APPLICATION

The present application is a Continuation Application of co-pending U.S. application Ser. No. 14/158,381, filed on Jan. 17, 2014, which is a Continuation Application of U.S. application Ser. No. 13/441,202, filed on Apr. 6, 2012. Further, this application claims the benefit of priority of Japanese application serial numbers 2011-084715, filed on Apr. 6, 2011, and 2011-143179, filed on Jun. 28, 2011. The disclosures of these prior US and Japanese applications are incorporated herein by reference.

BACKGROUND OF THE INVENTION

Description of the Related Art

Previously, semiconductor devices (semiconductor power devices) are mainly used in systems within the fields of power electronics such as motor control systems and power conversion systems, and such application has attracted most of the attention of the practitioners and scholars as to the application of such devices.

For example, FIG. 1 of Patent Document 1 discloses a Schottky barrier diode employing SiC. The Schottky barrier diode includes: an n-type 4H—SiC block-shaped substrate; an n-type epitaxial layer growing on the block-shaped substrate; an oxide film formed on a surface of the epitaxial layer and partially exposing the surface of the epitaxial layer; and a Schottky electrode formed in an opening of the oxide film and performing Schottky junction for the epitaxial layer.

In addition, FIG. 8 of Patent Document 1 discloses a vertical metal-insulator semiconductor (MIS) field effect transistor employing SiC. The vertical MIS field effect transistor includes: an n-type 4H—SiC block-shaped substrate; an n-type epitaxial layer growing on the block-shaped substrate; an n-type impurity region (a source region) formed on a surface layer portion of the epitaxial layer; a p-type well region formed adjacent to two sides of the n-type impurity region; a grid oxide film formed on a surface of the epitaxial layer; and a grid electrode opposite to the p-type well region and separated by the grid oxide film.

Patent Document 1: Japanese Patent Publication No. 2005-79339

Patent Document 2: Japanese Patent Publication No. 2011-9797

SUMMARY OF THE INVENTION

A semiconductor device of the present invention includes: a first conductivity type semiconductor layer, including a wide bandgap semiconductor and having a surface and a back surface, where trenches each having side walls and a bottom wall are formed on the side of the surface; and a Schottky electrode, formed to be connected to the surface of the semiconductor layer. An edge portion of the bottom wall of the trench has a radius of curvature, R, satisfying the expression (1) as set out below:

$$0.01\ L < R < 10\ L \qquad (1),$$

(where, in the expression (1), L represents the straight-line distance between the edge portions opposite in a width direction of the trench).

The wide bandgap semiconductor has a breakdown voltage that is higher than that of silicon, and a semiconductor device using the wide bandgap semiconductor may have a high voltage resistance performance. The reason is that, when compared with silicon, the wide bandgap semiconductor has a very high insulation breakdown electric field intensity. Therefore, the Schottky barrier diode structure can be used for the design of a device having a high reverse voltage.

However, if a high reverse voltage is applied to a Schottky barrier diode, even if the diode is not broken down, a strong electric field is still applied to the wide bandgap semiconductor. Therefore, if the height of a Schottky barrier (the barrier height) between the Schottky electrode and the wide bandgap semiconductor is decreased to decrease a forward voltage of the Schottky barrier diode, then the electric field intensity in the wide bandgap semiconductor will be high, so that a leakage current (a reverse leakage current), which runs across from the Schottky barrier to flow, will increase when reverse voltage is applied.

To prevent an increase of the reverse leakage current, the Schottky barrier diode using the wide bandgap semiconductor has to further increase its barrier height to a certain degree, so that a high reverse voltage is not applied. Therefore, the following adverse situation may occur. The voltage resistance performance cannot be exerted, so that even if a high reverse voltage is applied the wide bandgap semiconductor can be prevented from being broken down.

Herein, the distribution of the electric field intensity when reverse voltage is applied is considered. First, if a reverse voltage is applied to a semiconductor layer (for example, n-type), which is not formed with any trench and includes the wide bandgap semiconductor, then the electric field intensity will normally increase in a direction from the back surface of the semiconductor layer to the surface, and reaches a maximum value at the surface of the semiconductor layer.

Therefore, in the Schottky barrier diode in which a Schottky electrode is used to perform the Schottky junction on the surface of the semiconductor layer of the structure to decrease the height of the of the Schottky barrier (the barrier height) between the Schottky electrode and the semiconductor layer, if a reverse voltage close to a breakdown voltage is applied, then the electric field intensity on the surface of the semiconductor layer is high, thereby making it difficult to reduce the reverse leakage current that runs across the Schottky barrier to flow.

Therefore, it is considered that trenches are formed in the semiconductor layer to shift the parts (generating sources of the leakage current) where the electric fields are concentrated to bottom portions of the trenches, and since the electric fields are concentrated at the edge portions of the bottom walls of the trenches, if the edge portions are sharp, the problem of incapability of achieving sufficient voltage resistance may occur.

Therefore, according to the present invention, the radius of curvature, R, of the edge portion of the bottom wall of the trench is able to satisfy 0.01 L<R<10 L, thereby alleviating the electric field concentrated at the edge portion of the bottom wall of the trench, and improving voltage resistance. The trenches are formed on the surface side of the semiconductor layer, so that the electric field intensity of the surface of the semiconductor layer can be definitely weakened. Therefore, the barrier height between the Schottky electrode connected to the surface of the semiconductor layer and the semiconductor layer can be decreased, thereby reducing the reverse leakage current even if a reverse voltage close to a breakdown voltage is applied. As a result, the occurrence of reverse leakage current can be decreased, and the barrier height can be decreased to decrease the forward voltage.

In the semiconductor device of the present invention, the semiconductor layer, preferably, includes a second conductivity type electric field moderating part, which is selectively formed on the bottom wall of the trench and the edge portions of the bottom wall.

More preferably, in the present invention, the second conductivity type (for example, p-type) electric field moderating part is formed on the bottom walls of the trenches and on the edge portions of the bottom walls. Therefore, the overall reverse leakage current of the semiconductor device can be effectively reduced. Even if a reverse voltage close to a breakdown voltage is applied, then the reverse leakage current can be effectively reduced, thereby fully exerting the voltage resistance performance of the wide bandgap semiconductor.

The electric field moderating part is more preferably formed to span between the edge portion of the bottom wall of the trench and the side wall of the trench, and particularly preferably formed to extend to the opening end of the trench along the side wall of the trench.

Furthermore, in the present invention, the Schottky electrode includes any of the following electrodes: a metal electrode for forming a Schottky barrier between the metal electrode itself and a semiconductor layer, and a semiconductor electrode which includes a heterogeneous semiconductor having a bandgap that is different from the bandgap of the semiconductor layer and performing heterogeneous junction (the junction in which a bandgap difference is used to form a potential barrier with the semiconductor layer) relative to the semiconductor layer. Hereinafter, the Schottky junction and the heterogeneous junction are collectively called "Schottky junction," the Schottky barrier and the potential barrier (the heterogeneous barrier) formed by the heterogeneous junction are collectively called "Schottky barrier," and the metal electrode and the semiconductor electrode are collectively called "Schottky electrode."

Furthermore, the trench, preferably, includes a tapered trench (tapered groove, at least partially inclined groove). The tapered trench has a planar bottom wall and side walls each inclining at an angle greater than 90° relative to the planar bottom wall.

For the case of the tapered trench, when compared with the case of the side walls erected relative to the bottom wall at an angle of 90°, the voltage resistance of the semiconductor device can be further increased.

Furthermore, in the tapered trench, not only the bottom wall but also part or all of the side walls are opposite to the open end of the trench. Therefore, for example, in the case that a second conductivity type impurity is implanted into the semiconductor layer through the trench, the impurity implanted into the trench through the open end of the trench can effectively impact the side walls of the trench. Therefore, the electric field moderating part is easily formed.

Furthermore, the tapered trench includes any of the following trenches: a trench in which all of the side walls are inclined relative to the bottom wall at an angle greater than 90°, and a trench in which a part of the side walls (the part forming the edge portions of the trench) are inclined relative to the bottom wall at an angle greater than 90°.

Furthermore, in the semiconductor device of the present invention, the Schottky electrode is preferably formed by filling the trench, the electric field moderating part has a contact portion at the part forming the bottom surface, and an ohmic junction is formed between the contact portion and the Schottky electrode filling the trench.

According to the structure, the Schottky electrode can perform ohmic junction relative to a pn diode having a pn junction of the electric field moderating part (the second conductivity type) and the semiconductor layer (the first conductivity type). The pn diode is disposed parallel to the Schottky barrier diode (a heterogeneous diode) having the Schottky junction of the Schottky electrode and the semiconductor layer. Therefore, even if there is a surge of current flow in the semiconductor device, a part of the surged current is enabled to flow into the built-in pn diode. Therefore, the surged current flowing through the Schottky barrier diode can be decreased, so that thermal destruction of the Schottky barrier diode caused by the surged current can be prevented.

Furthermore, in the semiconductor device of the present invention, preferably, a part of the semiconductor layer that is different from the electric field moderating part has a first conductivity type first part for applying a first electric field and a first conductivity type second part for applying a second electric field that is stronger than the first electric field when reverse voltage is applied, and in the case, the Schottky electrode includes: a first electrode, for forming a first Schottky barrier between the first electrode itself and the first part, and a second electrode, for forming a second Schottky barrier higher than the first Schottky barrier between the second electrode itself and the second part.

In the present invention, the following situation exists: as for the relationship between the first part and the second part of the semiconductor layer, one has a higher electric field intensity and the other has a lower electric field intensity.

Therefore, as described above, if the Schottky electrode is appropriately selected according to the electric field distribution of the semiconductor layer when reverse voltage is applied, at the second part applying to the second electric field being high when reverse voltage is applied, then the second Schottky barrier being high can be used to suppress the leakage current. On the other hand, when the first part applying to the first electric field is low, even if the height of the Schottky barrier is decreased, the possibility of the reverse leakage current flowing across the Schottky barrier is low, so that by setting the first Schottky barrier being low, current is enabled to take precedence to flow in the low voltage when forward voltage is applied. Therefore, according to the structure, the reverse leakage current and forward voltage can be decreased effectively.

Furthermore, for example, in the case that the electric field moderating part is formed to reach the opening end of the trench, the first part of the semiconductor layer is formed on a peripheral portion of the opening end of the trench of a surface layer portion of the semiconductor layer, and the second part of the semiconductor layer is formed on a part, which is in the surface layer portion of the semiconductor layer and adjacent to the peripheral portion.

Furthermore, in the semiconductor device of the present invention, preferably, the semiconductor layer includes a base drift layer having a first impurity concentration and a low-resistance drift layer which is formed on the base drift layer and has a second impurity concentration that is greater than the first impurity concentration, and the trench is formed so that the trench has a deepest portion reaching the low-resistance drift layer and is separated by a part of the semiconductor layer acting as a unit cell.

Regions (current paths), which are on the unit cells separated by the trenches and capable of enabling the current to flow, are limited so that if the part of the semiconductor layer that forms the unit cells has a low impurity concentration, the resistance value of the unit cells can increase. Therefore, the trench is formed in a manner in which the deepest portion of the trench reaches the low-resistance drift layer, so that all of a part of the unit cell can be formed by the low-resistance drift layer. At the part where the low-resistance drift layer is formed, even if the current path becomes narrower, the low-resistance drift layer having the second impurity concentration being high can be used to suppress the increase of the resistance value. Therefore, the resistance of the unit cells can be decreased.

Furthermore, the first impurity concentration of the base drift layer can decrease along a direction from the back surface of the semiconductor layer to the surface. Furthermore, the second impurity concentration of the low-resistance drift layer can be fixed along the direction from the back surface of the semiconductor layer to the surface, or decrease along the direction from the back surface of the semiconductor layer to the surface.

Furthermore, preferably, the semiconductor layer further includes a surface drift layer. The surface drift layer is formed on the low-resistance drift layer, and has a third impurity concentration that is lower than the second impurity concentration.

According to the structure, the impurity concentration of the surface layer portion of the semiconductor layer can be decreased, so that the intensity of the electric field applied to the surface layer portion of the semiconductor layer when reverse voltage is applied can be decreased. Therefore, the reverse leakage current can be further reduced.

Furthermore, the semiconductor device further includes a first conductivity type substrate which supports the semiconductor layer and includes the wide bandgap semiconductor, and the semiconductor layer further includes a buffer layer. The buffer layer is formed on the substrate and has a fourth impurity concentration that is higher than the first impurity concentration.

Furthermore, the trenches can include strip trenches formed to be strip-shaped, or lattice trenches formed to be lattice-shaped.

Furthermore, the wide bandgap semiconductor (with the bandgap being greater than 2 eV) is, for example, a semiconductor with the insulation breakdown electric field being greater than 1 MV/cm, specifically, SiC (for example, 4H—SiC with the insulation breakdown electric field being about 2.8 MV/cm and the width of the bandgap being about 3.26 eV), GaN (with the insulation breakdown electric field being about 3 MV/cm and the width of the bandgap being about 3.42 eV) and diamond (with the insulation breakdown electric field being about 8 MV/cm and the width of the bandgap being about 5.47 eV).

BRIEF DESCRIPTION OF THE DRAWINGS

FIG. 1A is an overall view, and FIG. 1B is an enlarged view of the major part;

FIGS. 16A, 16B, 16C, 16D, 16E and 16F are views showing variations of the cross-sectional shape of the trench: FIG. 16A shows a first variation, FIG. 16B shows a second variation, FIG. 16C shows a third variation, FIG. 16D shows a fourth variation, FIG. 16E shows a fifth variation, and FIG. 16F shows a sixth variation;

DETAILED DESCRIPTION OF THE INVENTION

Embodiments of the present invention are described below in detail with reference to the accompanying drawings.

<Overall Structure of Schottky Barrier Diode>

Figure 1A:
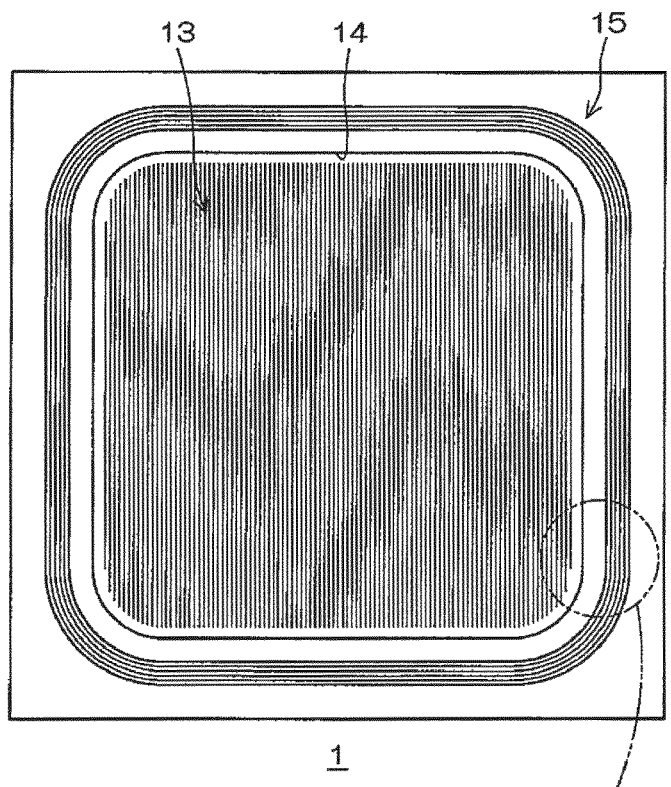
FIG. 1A and FIG. 1B are modeled plane views of a Schottky barrier diode according to an embodiment of the present invention, whereby
Figure 1B:
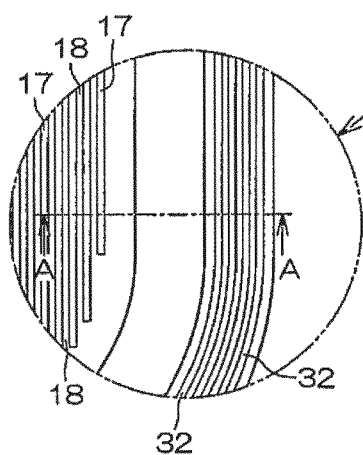
Figure 2:
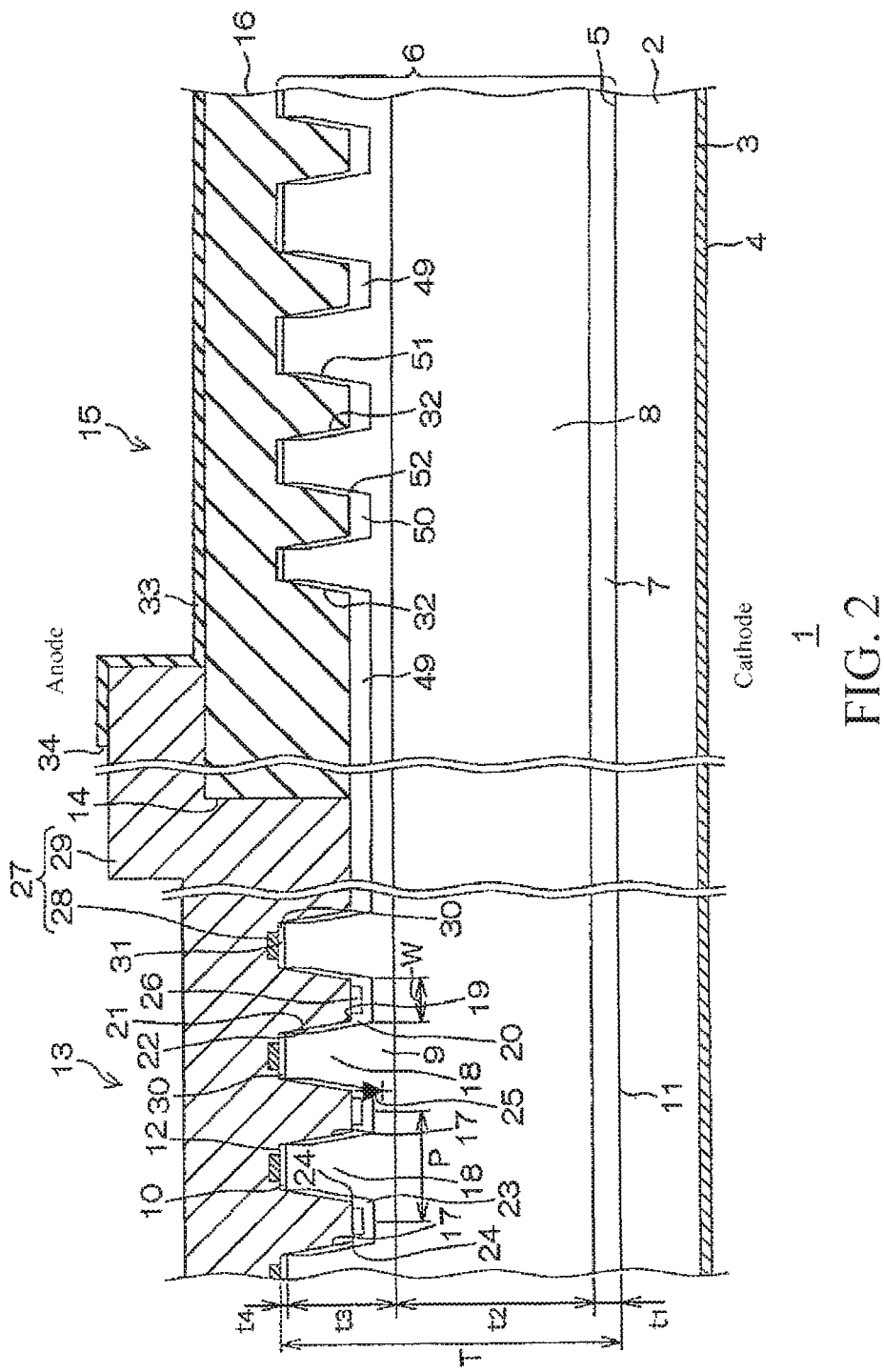
FIG. 2 is a cross-sectional view of the Schottky barrier diode shown in FIG. 1A and FIG. 1B, and shows a cut surface along an A-A cut line of FIG. 1B.
Figure 3:
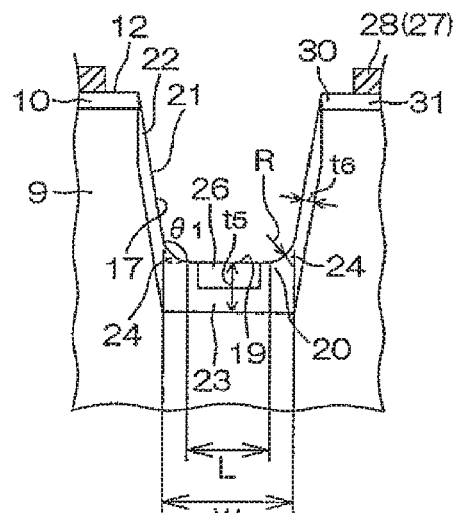
FIG. 3 is an enlarged view of a trench of FIG. 2.

FIG. 1A and FIG. 1B are modeled plane views of a Schottky barrier diode according to an embodiment of the present invention, whereby FIG. 1A is an overall view, and FIG. 1B is an enlarged view of the major part. FIG. 2 is a cross-sectional view of the Schottky barrier diode shown in FIG. 1A and FIG. 1B, and shows a cut surface along an A-A cut line of FIG. 1B. FIG. 3 is an enlarged view of a trench of FIG. 2.

A Schottky barrier diode 1, acting as a semiconductor device, is a Schottky barrier diode employing 4H—SiC (a wide bandgap semiconductor with an insulation breakdown electric field being about 2.8 MV/cm and the width of a bandgap being about 3.26 eV), and is, for example, in the shape of a square chip when viewed from the top. For the chip-shaped Schottky barrier diode 1, the measurements shown in FIG. 1(a) in the longitudinal and horizontal directions are in the scale of millimeter (mm)

The Schottky barrier diode 1 has an n$^+$-type SiC substrate 2. The thickness of the SiC substrate 2 is, for example, 50 μm to 600 μm. Furthermore, n-type impurities may be, for example, nitrogen (N), phosphorus (P) and arsenic (As).

A cathode electrode 4, acting as an ohmic electrode, is formed to cover a back surface 3 of the SiC substrate 2 completely. The cathode electrode 4 includes a metal (for example Ti/Ni/Ag) ohmically connected to the n-type SiC.

An n-type SiC epitaxial layer 6, acting as a semiconductor layer, is formed on a surface 5 of the SiC substrate 2.

The SiC epitaxial layer 6 has the following structure: a buffer layer 7 and a drift layer having a 3-layer structure of a base drift layer 8; and a low-resistance drift layer 9 and a surface drift layer 10 are laminated according to the order starting from the surface 5 of the SiC substrate 2. The buffer layer 7 forms a back surface 11 of the SiC epitaxial layer 6, and is connected to the surface 5 of the SiC substrate 2. On the other hand, the surface drift layer 10 forms a surface 12 of the SiC epitaxial layer 6.

The total thickness T of the SiC epitaxial layer 6 is, for example, 3 μm to 100 μm. The thickness $t_1$ of the buffer layer 7 is, for example, 0.1 μm to 1 μm. The thickness $t_2$ of the base drift layer 8 is, for example, 2 μm to 100 μm. The thickness $t_3$ of the low-resistance drift layer 9 is, for example, 1 μm to 3 μm. The thickness $t_4$ of the surface drift layer 10 is, for example, 0.2 μm to 0.5 μm.

The surface 12 of the SiC epitaxial layer 6 has an opening 14 enabling a part of the SiC epitaxial layer 6 to be exposed as an active region 13, and is formed with a field insulating film 16 of a field region 15 covering and surrounding the active region 13. The field insulating film 16 includes, for example, silicon dioxide ($SiO_2$). Furthermore, the thickness of the field insulating film 16 is, for example, 0.5 μm to 3 μm.

On the side of the surface 12 of the SiC epitaxial layer 6 in the active region 13, strip trenches are formed, which run from the surface 12 through the surface drift layer 10 and each have a deepest portion reaching an intermediate portion of the low-resistance drift layer 9. The strip trenches are formed in the following manner Multiple trapezoidal trenches 17 (trenches having cross-sections viewed to be in the shape of inverted trapezoids when obtained by cutting along the width direction orthogonal to the length direction thereof), extending along opposite directions of a set of opposite edges of the Schottky barrier diode 1 that is shaped as straight lines, are separated from one another and arranged in parallel at intervals. The distance (the spacing P) between centers of the adjacent trapezoidal trenches 17 is, for example, 2 μm to 20 μm.

Therefore, in the SiC epitaxial layer 6, strip-shaped unit cells 18 (linear cells) are formed and separated by being sandwiched by adjacent trapezoidal trenches 17. Each of the unit cells 18 has a base portion occupying more than half of the region thereof and is formed by the low-resistance drift layer 9, and each has a surface layer portion on the side of the surface 12 relative to the base portion and is formed by the surface drift layer 10.

Each of the trapezoidal trenches 17 is separated by a bottom wall 20 and side walls 22. The bottom wall 20 forms a bottom surface 19 parallel to the surface 12 of the SiC epitaxial layer 6. The side walls 22 form side surfaces 21, which are inclining from edge portions 24 of two end portions of the bottom wall 20 in the width direction towards the surface 12 of the SiC epitaxial layer 6 to form an angle $\theta_1$ (for example, 45° to 85°) with the bottom surface 19. The depth (the distance from the surface 12 of the SiC epitaxial layer 6 to the bottom surface 19 of the trapezoidal trench 17) of each of the trapezoidal trenches 17 is, for example, 0.3 Å to 15,000 Å. Furthermore, the width W orthogonal to the length direction (the width of the deepest portion) of each of the trapezoidal trenches 17 is 0.3 μm to 10 μm.

Furthermore, as shown in FIG. 3, the edge portions 24 of the bottom wall 20 of each of the trapezoidal trenches 17 are bent outwardly of the trapezoidal trench 17, and a bottom portion of each of the trapezoidal trenches 17 is formed to make the cross-section be U-shaped. The radius of curvature, R, of an inner surface (a bent surface) of the edge portion 24 with the above shape satisfies the expression (1) below:

$$0.01\ L < R < 10\ L \qquad (1).$$

In the expression (1), L represents the straight-line distance (only the unit for length, such as, μm, nm and m, is required and no other limits need to be specified) between the edge portions 24 opposite to each other in a width direction of the trench 17, and specifically is the width of the bottom surface 19 parallel to the surface 12 of the SiC epitaxial layer 6 and also is a value obtained by subtracting the width of the edge portions 24 from the width W of the trench 17.

Furthermore, the radius of curvature, R, of the edge portion 24 preferably satisfies $0.02\ L < R < 1\ L$ (2).

For example, the radius of curvature, R, can be obtained through the following mean: a Scanning Electron Microscope (SEM) is used to take a shot at the cross-section of the trapezoidal trench 17, and the curvature of the edge portion 24 can be measured from the obtained SEM image.

On the bottom wall 20 and side walls 22 of the trapezoidal trench 17, a p-type layer 23, acting as an electric field moderating part, is formed along an inner surface of the trapezoidal trench 17 by being exposed on the inner surface. The p-type layer 23 is formed starting from the bottom wall 20 of the trapezoidal trench 17, passing the edge portions 24, and finally reaching the opening end of the trapezoidal trench 17. Furthermore, a pn junction portion is formed between the p-type layer 23 and the n-type SiC epitaxial layer 6. Therefore, the Schottky barrier diode 1 has a built-in pn diode 25 including the p-type layer 23 and the n-type SiC epitaxial layer 6 (the low-resistance drift layer 9).

For the thickness (the depth starting from the inner surface of the trapezoidal trench 17) of the p-type layer 23 as shown in FIG. 3, the first thickness $t_5$ starting from the bottom surface 19 of the trapezoidal trench 17 and measuring along the depth direction (the direction perpendicular to the surface 12 of the SiC epitaxial layer 6) of the trapezoidal trench 17 is greater than the second thickness $t_6$ starting from the side surfaces 21 of the trapezoidal trench 17 and measuring along the width direction (the direction parallel to the surface 12 of the SiC epitaxial layer 6) of the trapezoidal trench 17. Specifically, the first thickness $t_5$ is, for example, 0.3 μm to 0.7 μm, and the second thickness $t_6$ is, for example, 0.1 μm to 0.5 μm.

Furthermore, a part of the p-type layer 23 on the bottom wall 20 of the trapezoidal trench 17 has a p$^+$-type contact portion 26 having a concentration of an implanted impurity that is higher than that of the other parts of the p-type layer 23. For example, the impurity concentration of the contact portion 26 is $1 \times 10^{20}$ cm$^{-3}$ to $1 \times 10^{21}$ cm$^{-3}$, and the impurity concentration of the other parts of the electric field moderating part excluding the contact portion 26 is $1 \times 10^{17}$ cm$^{-3}$ to $5 \times 10^{18}$ cm$^{-3}$.

The contact portion 26 is in the shape of a straight line along the length direction of the trapezoidal trench 17, and has the depth (for example, 0.05 μm to 0.2 μm) starting from the bottom surface 19 of the trapezoidal trench 17 to a midway portion of the p-type layer 23 in the depth direction.

An anode electrode 27, acting as a Schottky electrode, is formed on the field insulating film 16.

The anode electrode 27 includes: a first electrode 28 formed on a top portion of each of the unit cells 18, and a second electrode 29 formed to span the adjacent trapezoidal trenches 17 covers the first electrodes 28 at the top portions of the unit cells 18 and is sandwiched by the trapezoidal trenches 17.

The first electrode 28 is formed to be in the shape of a straight line along the length direction of the trapezoidal trench 17 on a central portion 31 that is at the top portion of each of the unit cells 18 and is sandwiched by peripheral portions 30 of opening ends of adjacent trapezoidal trenches 17.

The second electrode 29 is formed to cover the entire active region 13, and fills the trapezoidal trenches 17. Furthermore, the second electrode 29 covers, starting from the top, a peripheral portion of the opening 14 of the field insulating film 16, so as to protrude outwardly of the opening 14 to be in the shape of a flange. That is, the peripheral portion of the field insulating film 16 is sandwiched by the SiC epitaxial layer 6 (the surface drift layer 10) and the second electrode 29 through the upper and lower sides thereof throughout the whole periphery. Therefore, a circumferential region (that is, an inner edge portion of the field region 15) of the Schottky junction of the SiC epitaxial layer 6 is covered by the peripheral portion of the field insulating film 16 including SiC.

In the field region 15, on the side of the surface 12 of the SiC epitaxial layer 6, a ring-shaped trench 32 is formed, which runs from the surface 12 of the SiC epitaxial layer 6 through the surface drift layer 10 and has a deepest portion reaching an intermediate portion of the low-resistance drift layer 9. The ring-shaped trenches 32 are formed by arranging multiple trenches, which surround the active region 13 from one another, at parallel intervals. The intervals of the adjacent ring-shaped trenches 32 are set to increase in a direction departing from the active region 13. Therefore, the width of the part sandwiched by the adjacent ring-shaped trenches 32 increases in the direction departing from the active region 13.

Furthermore, on the bottom wall 50 and side walls 51 of the ring-shaped trench 32, a p-type layer 49 is formed along an inner surface of the ring-shaped trench 32 by being exposed on the inner surface. The p-type layer 49, the same as the p-type layer 23, is formed starting from the bottom wall 50 of the ring-shaped trench 32, passing edge portions 52 at two end portions of the bottom wall 50 in the width direction, and finally reaching the opening end of the ring-shaped trench 32.

The p-type layer 49 is formed in the same manner as the p-type layer 23, and has the same impurity concentration (for example, $1 \times 10^{17}$ cm$^{-3}$ to $5 \times 10^{18}$ cm$^{-3}$) and thickness as the p-type layer 23.

The outermost surface of the Schottky barrier diode 1 is formed with a surface protective film 33 including silicon nitride (SiN). A central portion of the surface protective film 33 is formed with an opening 34 exposing the anode electrode 27 (the second electrode 29). Bond wires are bonded to the second electrode 29 through the opening 34.

In the Schottky barrier diode 1, a forward bias state is formed in which a positive voltage is applied to the anode electrode 27 and a negative voltage is applied to the cathode electrode 4, so that electrons (carriers) move from the cathode electrode 4 to the anode electrode 27 through the active region 13 of the SiC epitaxial layer 6, and therefore creating a current flow.

<Effect of Introducing Trench Structure>

The effect of reducing a reverse leakage current and forward voltage by forming the trapezoidal trenches 17 and the p-type layer 23 at the SiC epitaxial layer 6 is illustrated below, with reference to FIG. 4 to FIG. 9. Furthermore, the trenches of FIG. 5 are rectangular trenches 17', and the trenches of FIG. 6 are U-shaped trenches 17".

Figure 4:
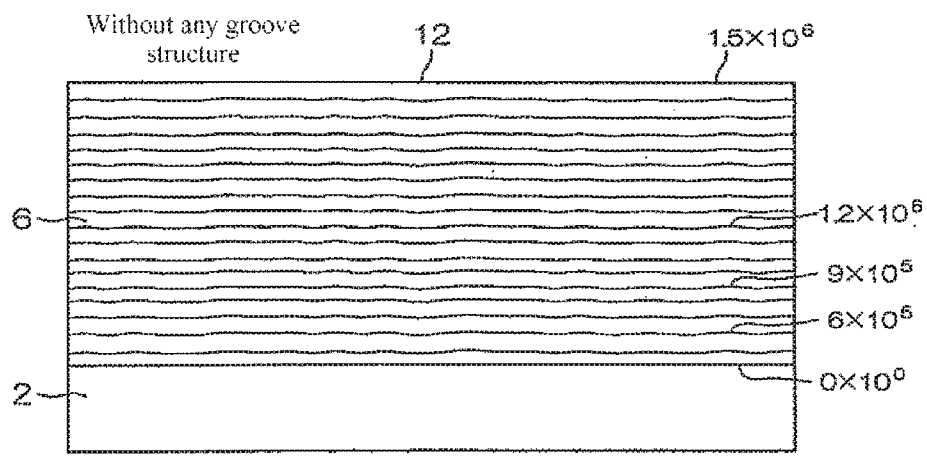
FIG. 4 is a distribution view of electric field intensity when a reverse voltage is applied (analog data), and shows a condition without any trench structure.
Figure 5:
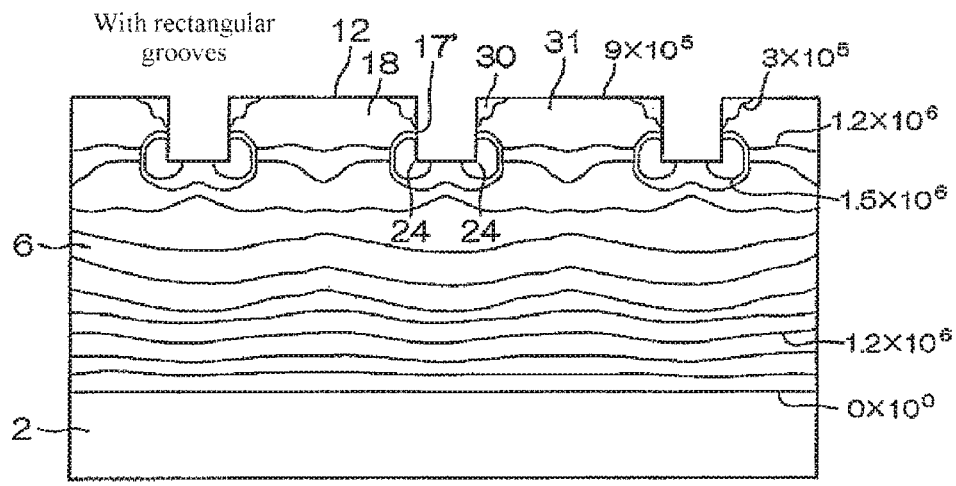
FIG. 5 is a distribution view of electric field intensity when a reverse voltage is applied (analog data), and shows a condition with rectangular trench structures.
Figure 6:
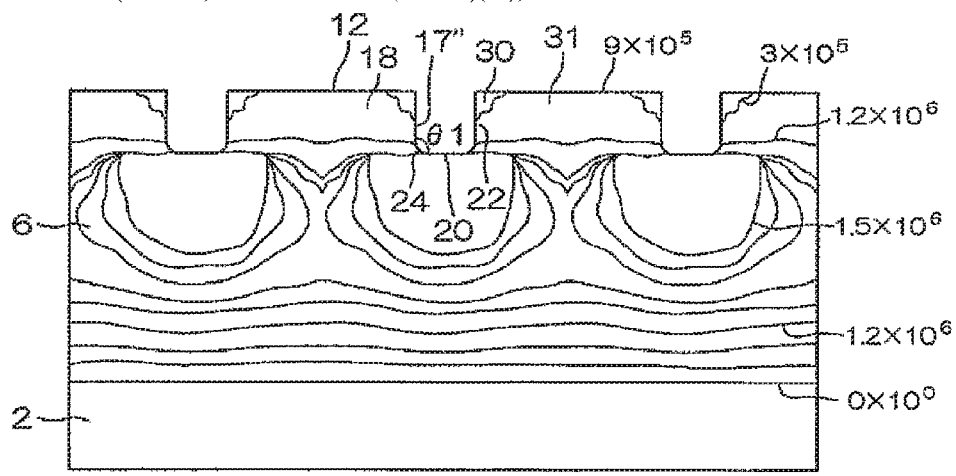
FIG. 6 is a distribution view of electric field intensity when a reverse voltage is applied (analog data), and shows a condition with U-shaped trench structures.
Figure 7:
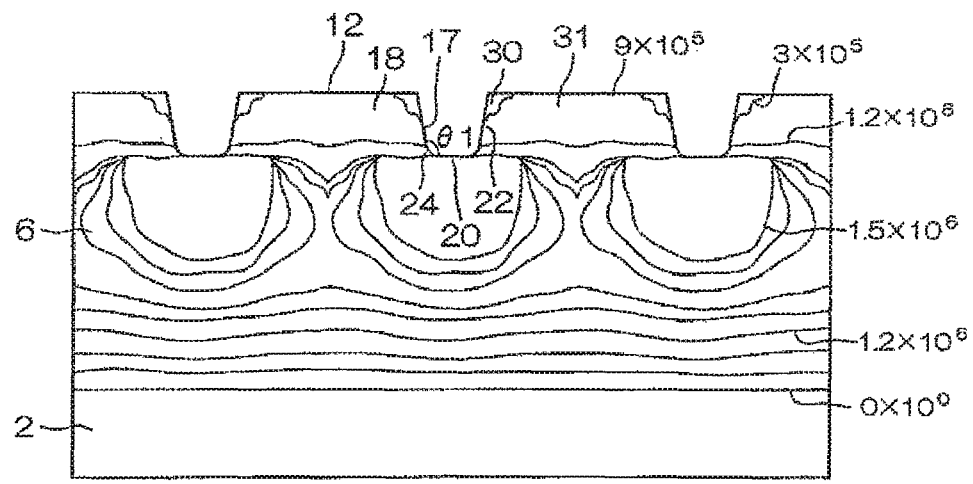
FIG. 7 is a distribution view of electric field intensity when a reverse voltage is applied (analog data), and shows a condition with trapezoidal trench structures.
Figure 8:
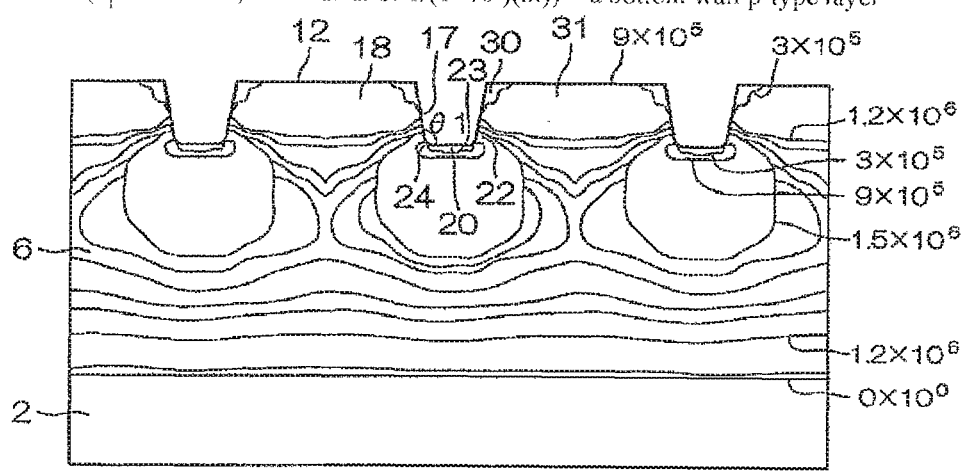
FIG. 8 is a distribution view of electric field intensity when a reverse voltage is applied (analog data), and shows a condition with trapezoidal trench structures+a bottom wall p-type layer.
Figure 9:
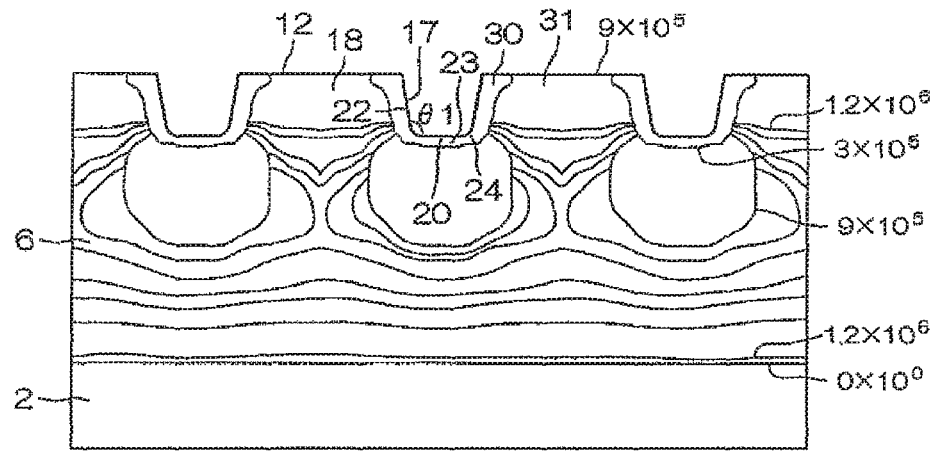
FIG. 9 is a distribution view of electric field intensity when a reverse voltage is applied (analog data), and shows a condition with trapezoidal trench structures+a side wall p-type layer.

FIG. 4 to FIG. 9 are distribution views of electric field intensity when a reverse voltage is applied (analog data). FIG. 4 shows a condition without any trench structure. FIG. 5 shows a condition with rectangular trench structures. FIG. 6 shows a condition with U-shaped trench structures ($\theta_1=90°$, R=0.125 L or $1/(1 \times 10^7)$(m)). FIG. 7 shows a condition with trapezoidal trench structures ($\theta_1=115°>90°$, R=0.125 L or $1/(1 \times 10^7)$(m)). FIG. 8 shows a condition with trapezoidal trench structures ($\theta_1=115°>90°$, R=0.125 L or $1/(1 \times 10^7)$(m)) with a bottom wall p-type layer. FIG. 9 shows a condition with trapezoidal trench structures ($\theta_1=115°>90°$, R=0.125 L or $1/(1 \times 10^7)$(m)) with a side wall p-type layer. The parts in FIG. 4 to FIG. 9 and the counterparts thereof in FIG. 1A, FIG. 1B, FIG. 2 and FIG. 3 have the same reference numerals.

First, the structures of FIG. 4 to FIG. 9 are designed as follows.

n$^+$-type SiC substrate 2: the concentration is $1 \times 10^{19}$ cm$^{-3}$, and the thickness is 1 μm.

n$^-$-type SiC substrate 6: the concentration is $1 \times 10^{16}$ cm$^{-3}$, and the thickness is 5 μm.

Trenches 17, 17' and 17": the depth is 1.05 μm.

The radius of curvature, R, of the edge portion 24 of the bottom wall 20 is $1/(1 \times 10^7)$(m).

p-type layer 23: the concentration is $1 \times 10^{18}$ cm$^{-3}$.

Furthermore, electric field intensity distribution in the SiC epitaxial layer 6 when a reverse voltage (600 V) is applied between the anode and cathode of the Schottky barrier diodes 1 having the respective structures of FIG. 4 to FIG. 9 is simulated. Furthermore, a simulator made by the Synopsys company and named TCAD is employed.

As shown in FIG. 4, the following can be determined In a Schottky barrier diode where no trench structure of any shape is formed and where the surface 12 of the SiC epitaxial layer 6 is flat, the electric field intensity increases in a direction from the back surface 11 of the SiC epitaxial layer 6 to the surface 12, and reaches a maximum value (about $1.5 \times 10^6$ V/cm) at the surface 12 of the SiC epitaxial layer 6.

Furthermore, as shown in FIG. 5, the following can be determined In a Schottky barrier diode where rectangular trench structures having sharp edge portions 24 are formed, due to the formation of the structure of the rectangular trenches 17', the electric field intensity of the section (the unit cell 18) that is sandwiched by the adjacent rectangular trenches 17' has decreased (the electric field intensity of the central portion 31 of the unit cell 18 is about $9 \times 10^5$ V/cm), but a strong electric field of $1.5 \times 10^6$ V/cm has been concentrated at the edge portion 24 of the bottom wall 20 of the rectangular trench 17'.

Accordingly, as shown in FIG. 6 and FIG. 7, the following can be determined In Schottky barrier diodes where the structure of the U-shaped trenches 17" and the structure of the trapezoidal trenches 17 are formed, and the p-type layer 23 is not formed on the inner walls of the trenches 17 and 17" due to the formation of the structures of the trenches 17 and 17", the electric field intensity of the section (the unit cell 18) that is sandwiched by the adjacent trapezoidal trenches 17 has decreased, and the parts having the highest electric field intensity shift, as a whole, to the bottom walls 20 of the trapezoidal trenches 17. Specifically, the electric field intensity of the central portion 31 of the unit cell 18 has decreased to about $9 \times 10^5$ V/cm, the electric field intensity of the peripheral portion 30 of the unit cell 18 has decreased to about $3 \times 10^5$ V/cm, and the overall electric field intensity of the bottom wall 20 of the trapezoidal trench 17 is the highest, being about $1.5 \times 10^6$ V/cm. Accordingly, it can be determined that local electric field concentration towards the edge portion 24 can be alleviated.

Therefore, the following can be determined. With the barrier height between the anode electrode 27 (the Schottky electrode) connected to the surface 12 (the surface of the unit cell 18) of the SiC epitaxial layer 6 and the SiC epitaxial layer 6 being decreased, even if a reverse voltage close to a breakdown voltage is applied, then the absolute amount of the reverse leakage current across the barrier height can be reduced because the electric field intensity of the part forming the barrier height is low. Therefore, it can be determined that the reverse leakage current can be reduced, and forward voltage can be decreased by reducing the barrier height.

On the other hand, the U-shaped trenches 17" and the trapezoidal trenches 17 are formed, and the parts (generating sources of the leakage current), where the electric fields are concentrated, in the SiC epitaxial layer 6 are shifted to the bottom portions of the trenches 17 and 17", so that, as shown in FIG. 8, the following can be determined. In a Schottky barrier diode where the p-type layer 23 is formed on the bottom walls 20 and the edge portions 24 of the trapezoidal trenches 17, the electric field intensity of the bottom walls 20 of the trapezoidal trenches 17 is decreased, and the parts having the highest electric field intensity is shifted to the side walls 22 of the trapezoidal trenches 17. Specifically, the electric field intensity of the bottom wall 20 of the trapezoidal trench 17 is decreased to be lower than $3 \times 10^5$ V/cm, and the electric field intensity of a lower portion of the side walls 22 of the trapezoidal trench 17 is the highest, being $1.5 \times 10^6$ V/cm.

Furthermore, in a Schottky barrier diode of FIG. 9 that has the same structure as shown in FIG. 1(a), FIG. 1(b) and FIG. 2, the following can be determined. The p-type layer 23 is also formed on the side walls 22 of the trapezoidal trenches 17, and the electric field intensity of the side walls 22 of the trapezoidal trenches 17 is decreased, so that the parts, where the electric fields are concentrated, are far away from the inner walls of the trapezoidal trenches 17. Specifically, the electric field intensity of the side walls 22 of the trapezoidal trench 17 is decreased to be lower than $3 \times 10^5$ V/cm, and the inner wall of the trapezoidal trench 17 does not have any region that has an electric field intensity greater than $1.5 \times 10^6$ V/cm.

According to the result, it can be determined that in the Schottky barrier diode 1 of FIG. 1(a), FIG. 1(b) and FIG. 2, the overall reverse leakage current of the Schottky barrier diode 1 can be effectively reduced. That is, in the Schottky barrier diode 1 having the structure as shown in FIG. 1(a), FIG. 1(b) and FIG. 2, even if a reverse voltage close to a breakdown voltage is applied, then the reverse leakage current can also be effectively decreased, thereby fully exerting the voltage resistance performance of the wide bandgap semiconductor.

Figure 14A:
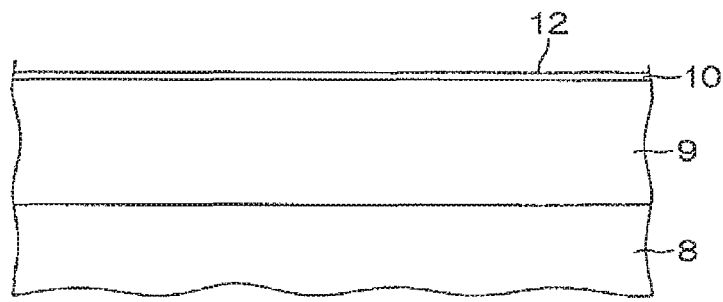
FIG. 14A is a view showing a method for forming the trenches and the p-type layer as shown in FIG. 2.
Figure 14B:
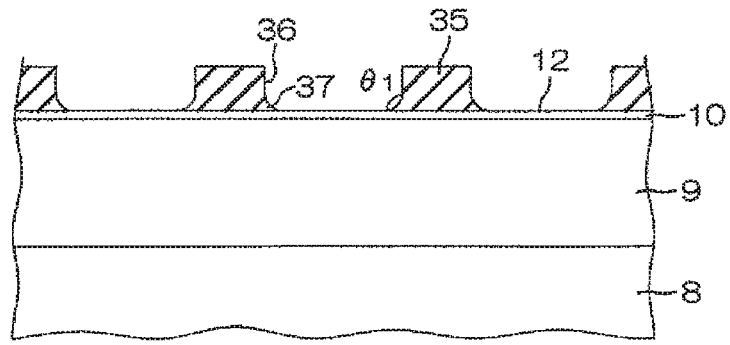
FIG. 14B is a view showing a next step of FIG. 14A.
Figure 14C:
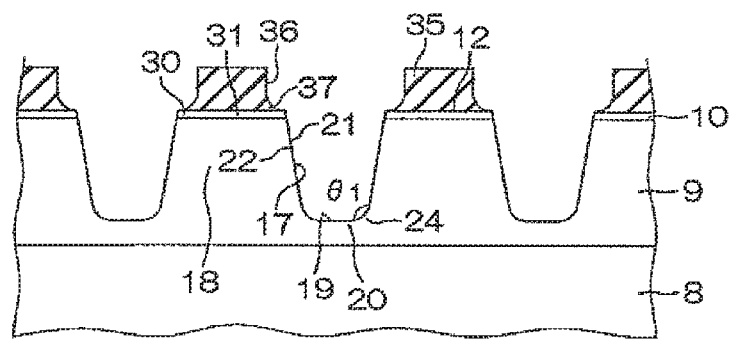
FIG. 14C is a view showing a next step of FIG. 14B.

Furthermore, as in steps as shown in FIG. 14C described below, when the trapezoidal trenches 17 are formed by dry etching, sometimes the side walls 22 of the trapezoidal trenches 17 can be damaged during etching, and the Schottky barrier cannot be formed between the side walls 22 and the anode electrode 27 as designed. Therefore, in the Schottky barrier diode 1 of this embodiment, the surface 12 of the SiC epitaxial layer 6 is covered and protected by a hard mask 35 (described later) during etching that mainly acts as a Schottky interface, and the p-type layer 23 is formed on the damaged side walls 22. Therefore, the side walls 22 of the trapezoidal trenches 17 can be effectively utilized. Furthermore, the part of the side walls 22 of the trapezoidal trenches 17 with high electric field intensity is formed with the high pn junction of the barrier, thereby reducing the leakage current.

<Effect of Built-in SiC-pn Diode>

The effect of forming the contact portion 26 at the p-type layer 23 to have a pn diode 25 built in the SiC epitaxial layer 6 is illustrated with reference to FIG. 10.

Figure 10:
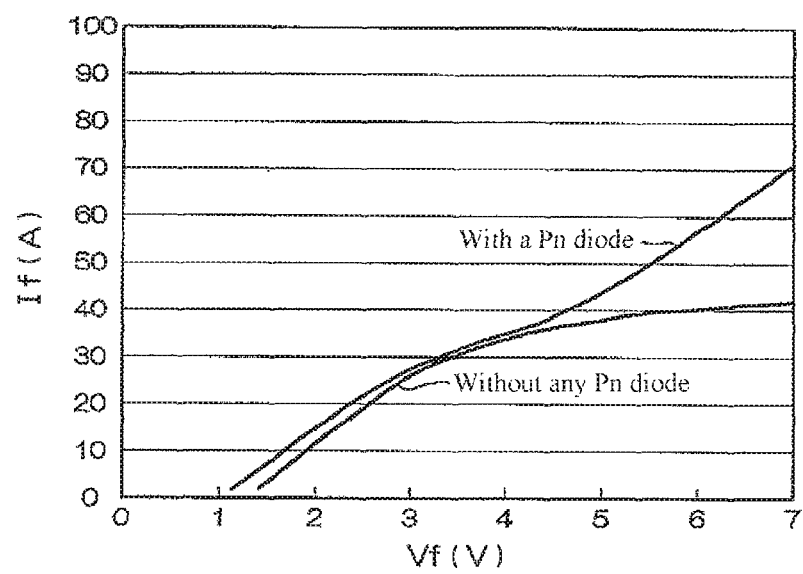
FIG. 10 is a chart showing current-voltage (I-V) curves of a built-in pn junction portion.

FIG. 10 is a chart showing current-voltage (I-V) curves of a built-in pn junction portion.

For the Schottky barrier diode of the structure shown in FIG. 1(a), FIG. 1(b), and FIG. 2, a forward voltage changing from 1 V to 7 V is applied to perform a power test. Furthermore, the variation in the current flowing into the pn junction portion of the Schottky barrier diode when the voltage changing from 1 V to 7 V is applied is evaluated.

On the other hand, the same power test is performed on the Schottky barrier diode having the same structure as that shown in FIG. 1(a), FIG. 1(b), and FIG. 2 except for the unformed contact portion 26 of the p-type layer 23, and the variation in the current flowing through the pn junction portion is evaluated.

As shown in FIG. 10, after the applied voltage exceeds about 4 V, the current at the pn junction portion having the p-type layer 23 not formed with the contact portion 26 almost does not increase and is substantially fixed.

Therefore, in the Schottky barrier diode having the p-type layer 23 formed with the contact portion 26 and the pn diode 25 being built-in, after the applied voltage exceeds about 4 V, the increase rate of the current increases dramatically when compared with the increase rate of the current being below 4 V.

Therefore, in FIG. 1(a), FIG. 1(b), and FIG. 2, the following can be determined. If ohmic junction is performed on the anode electrode 27 (the Schottky electrode) and the pn diode 25 is arranged to be parallel to the Schottky barrier diode 1, even if a large surge of current flows into the Schottky barrier diode, the built-in pn diode 25 can also be conducted, so that a part of the surged current flows through the built-in pn diode 25. As a result, it can be determined that, the surged current flowing through the Schottky barrier diode 1 can be decreased, thereby preventing thermal destruction of the Schottky barrier diode 1 caused by the surged current.

<Two Schottky Electrodes (First Electrode and Second Electrode)>

The efficiency of disposing two Schottky electrodes (the first electrode 28 and the second electrode 29) to decrease the reverse leakage current and forward voltage is illustrated below with reference to FIG. 11 and FIG. 12.

Figure 11:
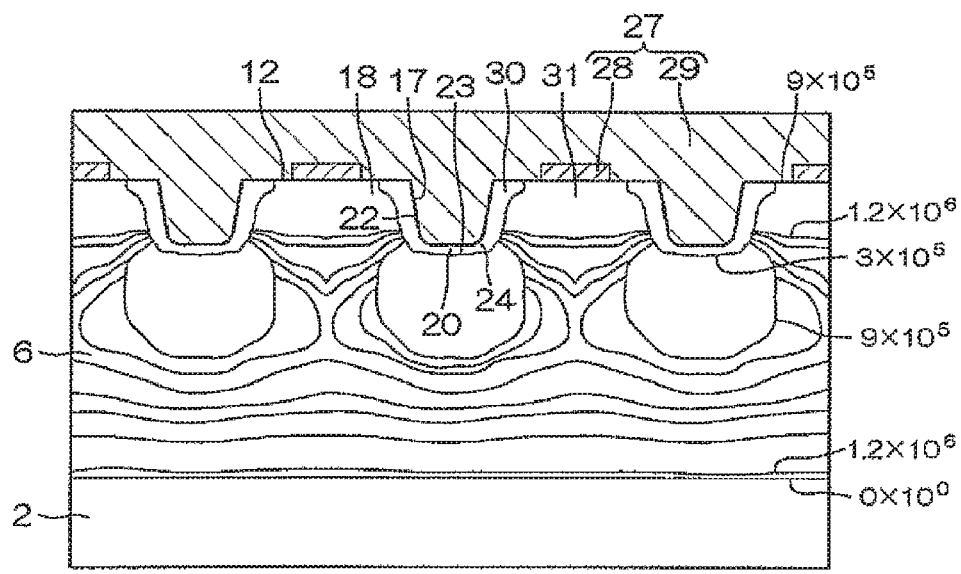
FIG. 11 is an enlarged view of the major components of the distribution view of the electric field intensity as shown in FIG. 9, and shows the enlarged vicinity of trenches of a Schottky barrier diode.

FIG. 11 is an enlarged view of the major components of the distribution view of the electric field intensity as shown in FIG. 9, and shows the enlarged vicinity of the trenches of the Schottky barrier diode. FIG. 12 is a chart of electric field intensity distribution of a surface of a unit cell of the Schottky barrier diode as shown in FIG. 11.

As described, in the Schottky barrier diode 1 of this embodiment, trapezoidal trenches 17 are formed, and the p-type layer 23 are formed on the bottom walls 20 and the side walls 22 of the trapezoidal trenches 17, thereby decreasing the electric field intensity of the surface 12 of the unit cell 18. Therefore, the electric field intensity, as an absolute value, distributed on the surface 12 of the unit cell 18 does not cause the reverse leakage current to increase, but sometimes parts can have a higher electric field intensity and parts can have a lower electric field intensity amongst the central portion 31 and the peripheral portion 30 of the unit cell 18.

Figure 12:
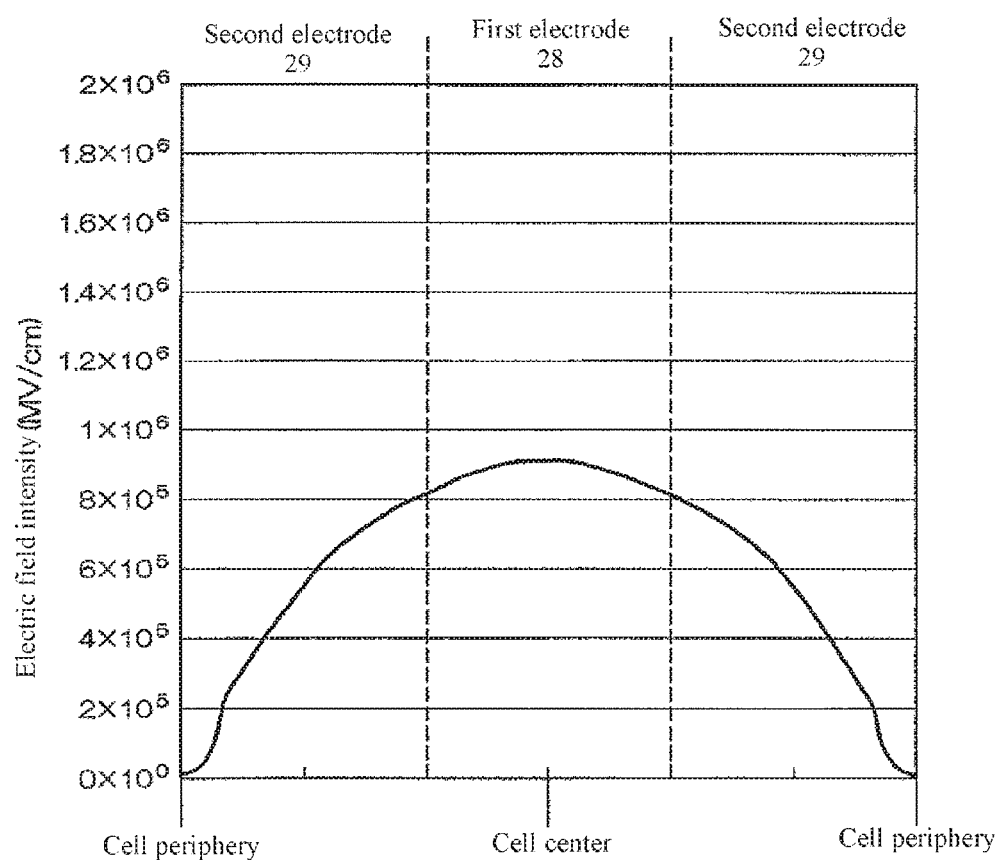
FIG. 12 is a chart of electric field intensity distribution of a surface of a unit cell of the Schottky barrier diode as shown in FIG. 11.

Specifically, as shown in FIG. 11 and FIG. 12, the electric field intensity of 0 MV/cm to 8.0×105 MV/cm is distributed at the peripheral portion 30, acting as the first part of the semiconductor layer, of the unit cell 18, and the electric field intensity of 8.0×105 MV/cm to 9.0×105 MV/cm is distributed at the central portion 31, acting as the second part of the semiconductor layer, of the unit cell 18. As for the electric field intensity distribution when reverse voltage is applied, the electric field intensity (the second electric field) of the central portion 31 of the unit cell 18 has significantly increased when compared with the electric field intensity (the first electric field) of the peripheral portion 30 of the unit cell 18.

Therefore, for the central portion 31 of the unit cell 18 under high electric field intensity, p-type polysilicon formed with a high potential barrier (for example, 1.4 eV) acts as the first electrode 28 to perform the Schottky junction. Furthermore, where the electrode is a polysilicon semiconductor electrode, heterogeneous junction between semiconductors of different bandgaps sometimes takes place in the Schottky junction.

On the other hand, for the peripheral portion 30 of the unit cell 18 under low electric field intensity, aluminum (Al) formed with a low potential barrier (for example, 0.7 eV) acts as the second electrode 29 to perform the Schottky junction.

Therefore, for the central portion 31 of the unit cell 18 under high electric field intensity when reverse voltage is applied, the high Schottky barrier (a second Schottky barrier) between the first electrode 28 (polysilicon) and the SiC epitaxial layer 6 can be used to suppress the reverse leakage current.

On the other hand, for the peripheral portion 30 of the unit cell 18 under low electric field intensity, even if the height of the Schottky barrier between the second electrode 29 (Al) and the SiC epitaxial layer 6 is decreased, the possibility of the reverse leakage current flowing across the Schottky barrier is low. Therefore, by setting the low Schottky barrier (a first Schottky barrier), the current is enabled to take precedence when flowing under the low voltage when forward voltage is applied.

Therefore, the following can be determined The anode electrode 27 (the Schottky electrode) is appropriately selected according to the distribution of the electric field intensity of the unit cell 18 when reverse voltage is applied, thereby decreasing the reverse leakage current and forward voltage effectively.

<Impurity Concentration of SiC Epitaxial Layer>

Values of the impurity concentration of the SiC substrate 2 and the SiC epitaxial layer 6 are illustrated below with reference to FIG. 13.

Figure 13:
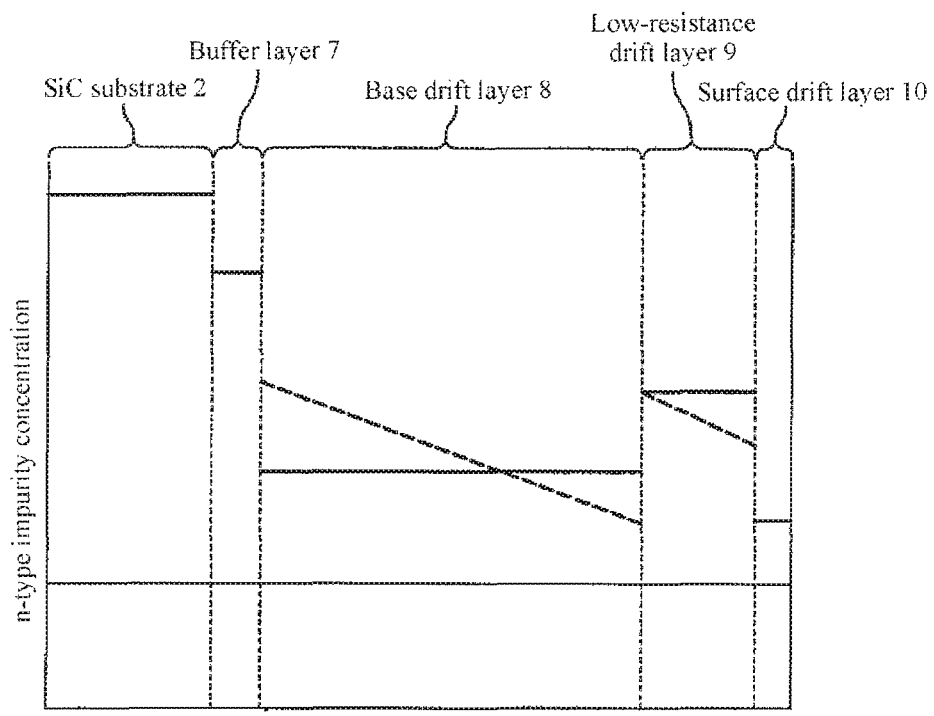
FIG. 13 is a view showing impurity concentrations of an SiC substrate and an SiC epitaxial layer.

FIG. 13 is a view showing impurity concentrations of an SiC substrate and an SiC epitaxial layer.

As shown in FIG. 13, the SiC substrate 2 and the SiC epitaxial layer 6 both include n-type SiC including n-type impurities. Values of the impurity concentrations to be satisfied are: SiC substrate 2>buffer layer 7>drift layers 8 to 10.

The concentration in the SiC substrate 2 is, for example, fixed along the thickness direction thereof, that is, $5\times10^{18}$ $cm^{-3}$ to $5\times10^{19}$ $cm^{-3}$. The concentration in the buffer layer 7 is, for example, fixed along the thickness direction thereof, that is, $1\times10^{17}$ $cm^{-3}$ to $5\times10^{18}$ $cm^{-3}$, or becomes lower along the surface.

The concentration in the drift layers 8 to 10 changes across the steps with the boundaries being the interfaces of the base drift layer 8, of the low-resistance drift layer 9 and of the surface drift layer 10. That is, for the interfaces, a concentration difference exists between the layer on the side of the surface 12 and the layer on the side of the back surface 11.

The concentration of the base drift layer 8 is, for example, fixed along the thickness direction thereof, that is, $5\times10^{14}$ $cm^{-3}$ to $5\times10^{16}$ $cm^{-3}$. Furthermore, the concentration of the base drift layer 8 may, as indicated by the dotted line in FIG. 13, decrease continuously from about $3\times10^{16}$ $cm^{-3}$ to about $5\times10^{15}$ $cm^{-3}$ along the direction from the back surface 11 of the SiC epitaxial layer 6 to the Surface.

The concentration of the low-resistance drift layer 9 is higher than that of the base drift layer 8 and is, for example, fixed along the thickness direction thereof, that is, $5\times10^{15}$ $cm^{-3}$ to $5\times10^{17}$ $cm^{-3}$. Furthermore, the concentration in the low-resistance drift layer 9 may, as indicated by the dotted line in FIG. 13, decrease continuously from about $3\times10^{17}$ $cm^{-3}$ to about $5\times10^{15}$ $cm^{-3}$ along the direction from the back surface 11 of the SiC epitaxial layer 6 to the surface.

The concentration of the surface drift layer 10 is lower than that of the base drift layer 8 and that of the low-resistance drift layer 9 and is, for example, fixed along the thickness direction thereof, that is, $5\times10^{14}$ $cm^{-3}$ to $1\times10^{16}$ $cm^{-3}$.

As shown by FIG. 1(a), FIG. 1(b), and FIG. 2, for the unit cells 18 (linear cells) separated by the strip-shaped trapezoidal trenches 17, a region (a current path) in which the current can flow is limited by the width of the spacing P of the trapezoidal trenches 17, so that if the impurity concentration of the part, formed with the unit cells 18, of the SiC epitaxial layer 6 is low, the resistance value of the unit cells 18 can be increased.

Therefore, as shown in FIG. 13, by setting the concentration of the low-resistance drift layer 9 that forms the base portion of the unit cell 18 to be higher than that of the base drift layer 8, even if the current path is limited by the spacing P of the trapezoidal trenches 17, the low-resistance drift layer 9 having a high concentration can be used to suppress the increase of the resistance value of the unit cells 18. Therefore, the resistance of the unit cells 18 can be decreased.

On the other hand, the surface drift layer 10 having a low concentration is disposed at the surface layer portion of the unit cell 18 connected to the anode electrode 27 (the Schottky electrode), thereby decreasing the electric field intensity applied to the surface 12 of the SiC epitaxial layer 6 when reverse voltage is applied. Therefore, the reverse leakage current can further be reduced.

<Method for Forming Trenches and p-type Layer>

The trapezoidal trenches 17 as shown in FIG. 2 are taken as an example to illustrate a method for forming the trapezoidal trenches 17 and the p-type layer 23 as set out below with reference to FIG. 14A to FIG. 14D.

FIG. 14A to FIG. 14D are views showing a method for forming the trenches and the p-type layer as shown in FIG. 2 according to the sequence of steps.

First, as shown in FIG. 14A, on the SiC substrate 2, the buffer layer 7, the base drift layer 8, the low-resistance drift layer 9 and the surface drift layer 10 undergo epitaxial growth according to this order.

Then, as shown in FIG. 14B, for example, a Chemical Vapor Deposition (CVD) method is used to form the hard mask 35 including $SiO_2$ at the surface 12 of the SiC epitaxial layer 6. The thickness of the hard mask 35 is preferably 1 µm to 3 µm. Then, the publicly known photolithographic technique and etching technique are used to pattern the hard mask 35. In this case, the etching conditions are set based on the fact that the etching amount (thickness) is 1 to 1.5 times of the thickness of the hard mask 35. Specifically, when the thickness of the hard mask 35 is 1 µm to 3 µm, the etching conditions (the gas type and the etching temperature) are set based on the etching amount being 1 µm to 4.5 µm. Therefore, for the SiC epitaxial layer 6, the over etching amount is smaller than the normal amount, so that at a lower portion of a side wall of an opening 36 of the hard mask 35 after the etching, an edge portion 37 inclined at an angle $\theta_1$ (100° to 170°>90°) relative to the surface 12 of the SiC epitaxial layer 6 can be formed.

Then, as shown in FIG. 14C, through the hard mask 35, dry etching is performed on the SiC epitaxial layer 6 from the surface 12 until the depth where the deepest portion reaches an intermediate portion of the low-resistance drift layer 9, thereby forming the strip-shaped trapezoidal trenches 17. The etching conditions in this case are set out as follows: the gas type is $O_2+SF_6+HBr$, the bias is 20 W to 100 W, and the internal pressure of the device is 1 Pa to 10 Pa. Therefore, the edge portion 24 of the bottom wall 20 can be formed to be curved. Furthermore, the edge portion 37 of the specific angle $\theta_1$ is formed on the lower portion of the side wall of the opening 36 of the hard mask 35, so that the side surfaces 21 of the trapezoidal trench 17 can be inclined at the angle $\theta_1$ relative to the bottom surface 19 of the trapezoidal trench 17.

Figure 14D:
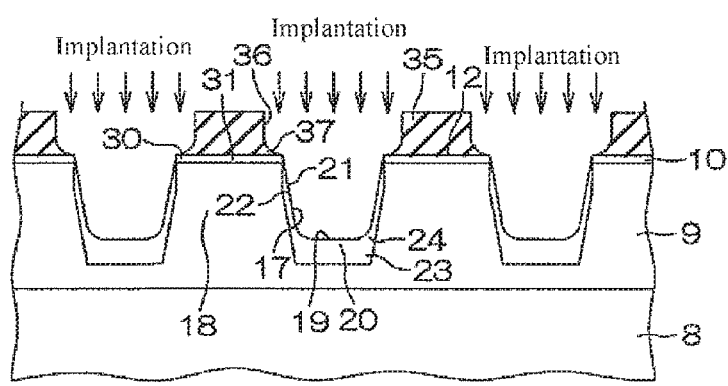
FIG. 14D is a view showing a next step of FIG. 14C.

Then, as shown in FIG. 14D, the hard mask 35 being used during the formation of the trapezoidal trenches 17 is kept, and a p-type impurity (for example, Al) is implanted into the trapezoidal trenches 17 through the hard mask 35. The dozing of the p-type impurity is achieved through, for example, an ion implantation method, in which ions with the energy being 380 keV and the dose being $2\times10^{13}$ $cm^{-2}$ are implanted. After the dozing of the impurity, annealing treatment is performed at, for example, 1,700° C., thereby forming the p-type layer 23.

According to the formation method, the hard mask 35 being used during the formation of the trapezoidal trenches 17 is used to perform the ion implantation, so that when forming the p-type layer 23, the step of forming a mask is not required to be added.

Furthermore, by adjusting the thickness of the hard mask 35 appropriately, the trapezoidal trenches 17 can be precisely formed as designed, and during ion implantation, the impurity can be prevented from being implanted into parts other than the trapezoidal trenches 17 (for example, the top portions of the unit cells 18). Therefore, the n-type region used for the Schottky junction with the anode electrode 27 can be ensured.

Furthermore, in the trapezoidal trench 17, not only the bottom wall 20 but also the both side walls 22 are opposite to an open end of the trapezoidal trench 17. Therefore, in the case that the p-type impurity is implanted into the SiC epitaxial layer 6 through the trapezoidal trenches 17, the impurity implanted into the trapezoidal trenches 17 through the open ends of the trapezoidal trenches 17 can effectively impact the side walls 22 of the trapezoidal trenches 17. Therefore, the p-type layer 23 can be easily formed.

<Relationship between Trenches and SiC Crystalline Structure>

The relationship between the trenches and the SiC crystalline structure is illustrated below with reference to FIG. 15A and FIG. 15B.

Figure 15A:
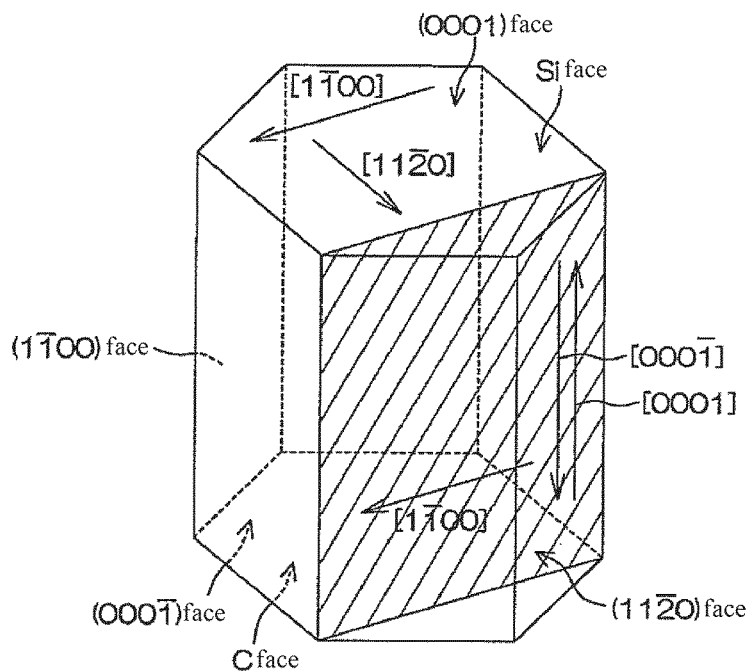
FIG. 15A and FIG. 15B provide a mode view of a unit cell of a 4H—SiC crystalline structure.
Figure 15B:
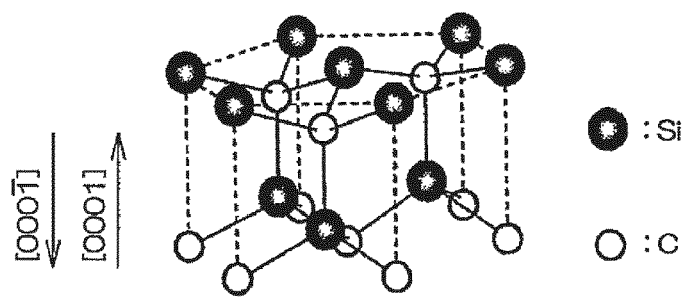

FIG. 15A and FIG. 15B provide a mode view of a unit cell of a 4H—SiC crystalline structure.

The SiC used in the Schottky barrier diode 1 of this embodiment is classified into 3C—SiC, 4H—SiC and 6H—SiC according to the crystalline structure.

The 4H—SiC crystalline structure is approximate to a hexagonal crystal system, in which each silicon atom is combined with four carbon atoms. Four carbon atoms are at four vertexes of a regular tetrahedron, the center of which is disposed with a silicon atom. Among the four carbon atoms, a silicon atom is in a [0001] axis direction relative to a carbon atom, and the other three carbon atoms are on the side of a [000-1] axis relative to silicon atom cluster atoms.

The [0001] axis and the [000-1] axis are along the axial direction of a hexagonal prism. A face (the top face of the hexagonal prism) with the [0001] axis being the normal is a (0001) face (Si face). On the other hand, a face (the bottom face of the hexagonal prism) with the [000-1] axis being the normal is a (000-1) face (C face).

A side face, with [1-100] axis being the normal, of the hexagonal prism is a (1-100) face, and a face passing through a pair of ridges not adjacent to each other and with an [11-20] axis being the normal is an (11-20) face. The faces are crystalline faces forming right angles with the (0001) face and the (000-1) face.

Furthermore, in this embodiment, the SiC substrate 2 with the (0001) face being the main face is preferably used, on which the SiC epitaxial layer 6 grows with the (0001) face becoming the main face. Furthermore, the trapezoidal trench 17 is preferably formed with the surface position of the side surfaces 21 being the (11-20) face.

<Variations of Cross-section Shape of Trench>

Variations of the cross-section shape of the trapezoidal trench 17 are illustrated below with reference to FIG. 16A to FIG. 16F.

FIG. 16A to FIG. 16F are views showing variations of the cross-sectional shape of the trench: FIG. 16A shows a first variation, FIG. 16B shows a second variation, FIG. 16C shows a third variation, FIG. 16D shows a fourth variation, FIG. 16E shows a fifth variation, and FIG. 16F shows a sixth variation.

In the trapezoidal trench 17, for example, as shown in FIG. 16A, the contact portion 26, being the same as the p-type layer 23, can be formed to span the whole inner surface of the trapezoidal trench 17, and to extend from the bottom wall 20, passing the edge portions 24 to the opening end of the trapezoidal trench 17.

Furthermore, in the illustration of FIG. 2 and FIG. 3, for the cross-section shape of the trapezoidal trench 17, only the side surfaces 21 of each of the trapezoidal trenches 17 inclining at the angle $\theta_1$ (>90°) relative to the bottom surface 19 is used as an example, but the cross-section shape of the trench is not limited thereto.

For example, in the trapezoidal trench, it is not required that the whole side surfaces 21 are inclined. For example, as in an alternative trapezoidal trench 41 of FIG. 16B and FIG. 16C, a part of a side surface 39 (a lower portion 42 of the side surface 39) is selectively to become trapezoidal (tapered), and the other part of the side surface 39 (an upper portion 43 of the side surface 39) forms an angle of 90° relative to the bottom surface 19. In this case, the p-type layer 23 is only formed on the lower portion 42 (the trapezoidal portion) of the side surface 39 from the bottom wall 20 of the alternative trapezoidal trench 41 passing the edge portions 24. Furthermore, alternatively, the contact portion 26 can, as shown in FIG. 16B, only be formed on the bottom wall 20 of the alternative trapezoidal trench 41, or as shown in FIG. 16C, being the same as the p-type layer 23, and be formed from the bottom wall 20 of the alternative trapezoidal trench 41, passing the edge portions 24 to an upper end of the lower portion 42 of the side surface 39.

Furthermore, in the structure as shown in FIG. 16B and FIG. 16C, the lower portion 42 of the side surface 39 is opposite to the open end of the alternative trapezoidal trench 41, thereby facilitating the formation of the p-type layer 23.

Furthermore, the alternative trapezoidal trench 41 of FIG. 16B can be formed by using, for example, the steps as shown in FIG. 17A to FIG. 17D.

Figure 17A:
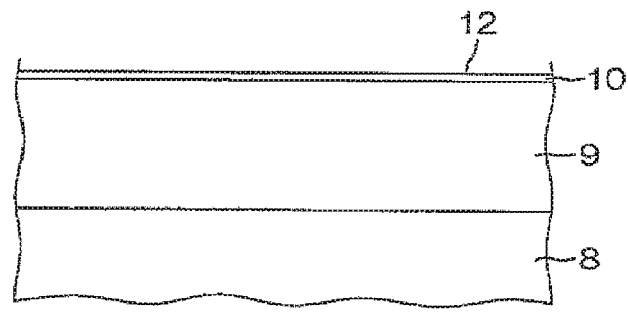
FIG. 17A is a view showing a method for forming the trench and the p-type layer as shown in FIG. 16A.

Specifically, as shown in FIG. 17A, on the SiC substrate 2, the buffer layer 7, the base drift layer 8, the low-resistance drift layer 9 and the surface drift layer 10 first undergo epitaxial growth according to this order.

Figure 17B:
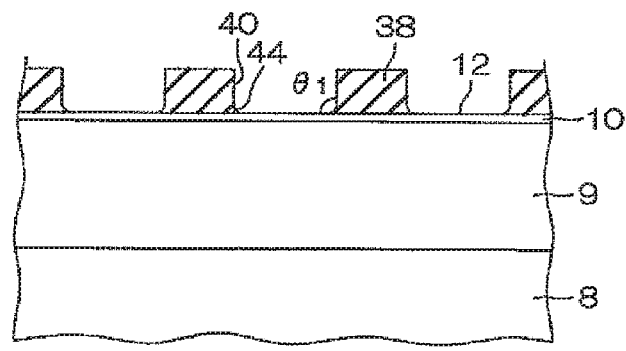
FIG. 17B is a view showing a next step of FIG. 17A.

Then, as shown in FIG. 17B, for example, a CVD method is used to form a hard mask 38 including $SiO_2$ at the surface 12 of the SiC epitaxial layer 6. The thickness of the hard mask 38 is preferably 1 µm to 3 µm. Then, the publicly known photolithographic technique and etching technique are used to pattern the hard mask 38. In this case, the etching conditions are set based on the fact that the etching amount (thickness) is 1.5 to 2 times of the thickness of the hard mask 38. Specifically, when the thickness of the hard mask 38 is 1 µm to 3 µm, the etching conditions (the gas type and the etching temperature) are set based on the etching amount being 1.5 µm to 6 µm. The etching conditions are the conditions of setting the following based on the over etching amount. That is, the over etching amount is greater than the over etching amount that is set when the hard mask 35 is etched as seen in the step of FIG. 14B. Therefore, at a lower portion of a side wall of an opening 40 of the hard mask 38 after the etching, an edge portion 44 can be formed, which is inclined at an angle $\theta_1$ (91° to 100°>90°) relative to the surface 12 of the SiC epitaxial layer 6 and is smaller than the edge portion 37 (as shown in FIG. 14B).

Figure 17C:
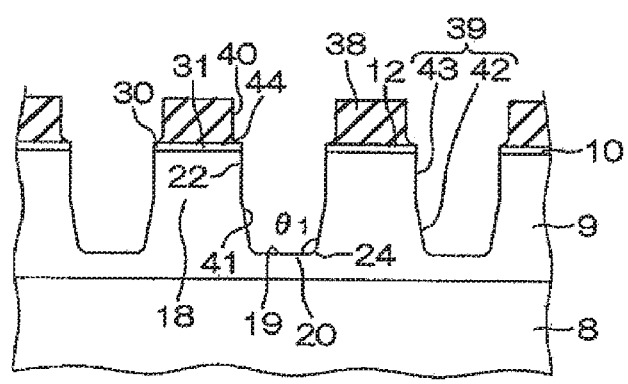
FIG. 17C is a view showing a next step of FIG. 17B.

Then, as shown in FIG. 17C, through the hard mask 38, dry etching is performed on the SiC epitaxial layer 6 from the surface 12 until the depth where the deepest portion reaches an intermediate portion of the low-resistance drift layer 9, thereby forming the strip-shaped alternative trapezoidal trench 41. The etching conditions in this case are set out as follows: the gas type is $O_2+SF_6+HBr$, the bias is 20 W to 100 W, and the internal pressure of the device is 1 Pa to 10 Pa. Therefore, the edge portion 24 of the bottom wall 20 can be formed to be curved. Furthermore, the edge portion 44 smaller than the edge portion 37 is formed on the lower portion of the side wall of the opening 40 of the hard mask 38, so that only the lower portion 42 of the side surface 39 of the alternative trapezoidal trench 41 is inclined at the angle $\theta_1$ relative to the bottom surface 19, thereby making the upper portion 43 of the side surface 39 form an angle of 90° with the bottom surface 19 (perpendicular).

Figure 17D:
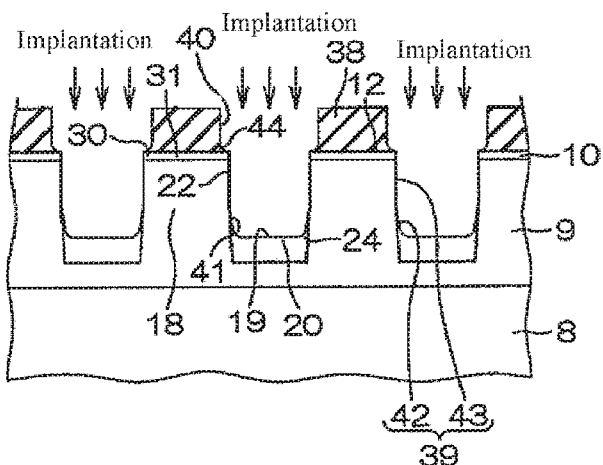
FIG. 17D is a view showing a next step of FIG. 17C.

Then, as shown in FIG. 17D, the hard mask 38 being used during the formation of the alternative trapezoidal trench 41 is kept, and a p-type impurity (for example, Al) is implanted into the alternative trapezoidal trench 41 through the hard mask 38. The dozing of the p-type impurity is achieved through, for example, an ion implantation method, in which ions with the energy being 380 keV and the dose being $2 \times 10^{13}$ $cm^{-2}$ are implanted. After the dozing of the impurity, annealing treatment is performed at, for example, 1,700° C., thereby forming the p-type layer 23.

Furthermore, in the trench, the side walls 22 are not required to be inclined. For example, as for the U-shaped trench 45 of FIG. 16D, FIG. 16E, and FIG. 16F, the side surfaces 21 form an angle of 90° with the bottom surface 19 (perpendicular). In this case, the p-type layer 23 can also, as shown in FIG. 16D and FIG. 16E, be formed from the bottom wall 20 of the U-shaped trench 45, passing the edge portions 24 to the opening end of the U-shaped trench 45, or, as shown in FIG. 16F, be only formed on the bottom wall 20 and the edge portions 24 of the U-shaped trench 45. Furthermore, alternatively, the contact portion 26 can, as shown in FIG. 16D and FIG. 16F, only be formed on the bottom wall 20 of the U-shaped trench 45, or as shown in FIG. 16C, being the same as the p-type layer 23, and be formed from the bottom wall 20 of the U-shaped trench 45, passing the edge portions 24 to the opening end of the U-shaped trench 45.

The U-shaped trench 45 of FIG. 16D can be formed by using, for example, steps as shown in FIG. 18A to FIG. 18G.

Figure 18A:
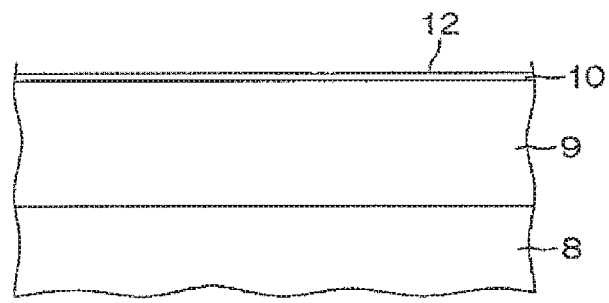
FIG. 18A a view showing a method for forming the trench and the p-type layer as shown in FIG. 16B.

First, as shown in FIG. 18A, on the SiC substrate 2, the buffer layer 7, the base drift layer 8, the low-resistance drift layer 9 and the surface drift layer 10 undergo epitaxial growth according to this order.

Figure 18B:
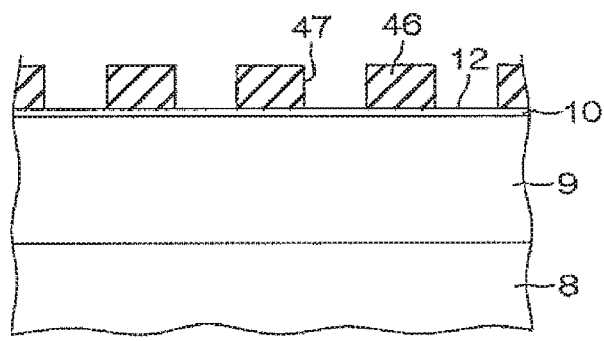
FIG. 18B is a view showing a next step of FIG. 18A.

Then, as shown in FIG. 18B, for example, a CVD method is used to form a hard mask 46 including $SiO_2$ at the surface 12 of the SiC epitaxial layer 6. The thickness of the hard mask 46 is preferably 1 µm to 3 µm. Then, the publicly known photolithographic technique and etching technique are used to pattern the hard mask 46. In this case, the etching conditions are set based on the fact that the etching amount (thickness) is 2 to 3 times of the thickness of the hard mask 46. Specifically, when the thickness of the hard mask 46 is 1 µm to 3 µm, the etching conditions (the gas type and the etching temperature) are set based on the etching amount being 2 µm to 6 µm. The etching conditions are the conditions of setting the following based on the over etching amount. That is, the over etching amount is greater than the over etching amount that is set when the hard mask 38 is etched as seen in the step of FIG. 17B. Therefore, a lower portion of the side wall of an opening 47 of the hard mask 46 after the etching forms an angle of 90° with the surface 12 of the SiC epitaxial layer 6 (perpendicular).

Figure 18C:
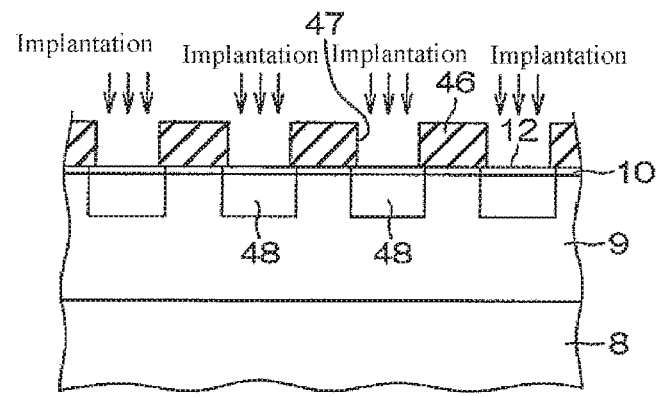
FIG. 18C is a view showing a next step of FIG. 18B.

Then, as shown in FIG. 18C, a p-type impurity (for example, Al) is implanted into the surface of the SiC epitaxial layer 6 through the patterned hard mask 46. The dozing of the p-type impurity is achieved by using, for example, an ion implantation method, in which ions with the energy being 380 keV and the dose being $2\times10^{13}$ cm$^{-2}$ are implanted. After the dozing of the impurity, annealing treatment is performed at, for example, 1,700° C., thereby forming a p-type layer 48.

Figure 18D:
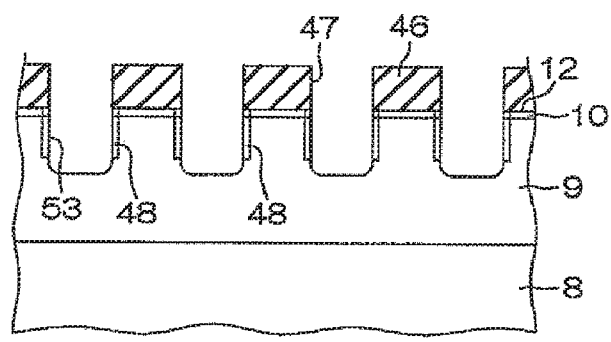
FIG. 18D is a view showing a next step of FIG. 18C.

Then, as shown in FIG. 18D, the hard mask 46 being used during the formation of the p-type layer 48 is kept, and through the hard mask 46, dry etching is performed on the SiC epitaxial layer 6 from the surface 12 to the depth that runs through a bottom portion of the p-type layer 48, thereby forming strip-shaped intermediate trenches 53. The remaining parts (side portions) of the p-type layer 48 are kept at side walls of the intermediate trenches 53.

Figure 18E:
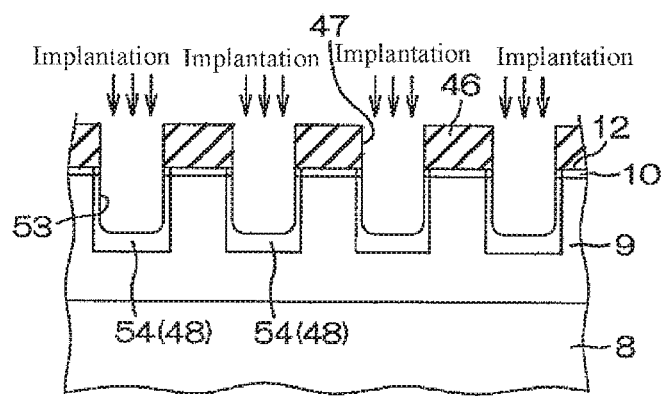
FIG. 18E is a view showing a next step of FIG. 18D.

Then, as shown in FIG. 18E, the hard mask 46 being used during the formation of the intermediate trenches 53 is kept, and a p-type impurity (for example, Al) is implanted into the intermediate trenches 53 through the hard mask 46. The dozing of the p-type impurity is achieved by using, for example, an ion implantation method, in which ions with the energy being 380 keV and the dose being $2\times10^{13}$ cm$^{-2}$ are implanted. After the dozing of the impurity, annealing treatment is performed at, for example, 1,700° C., so that the implanted impurity is mixed with the impurity of the p-type layer 48, thereby forming a p-type layer 54.

Figure 18F:
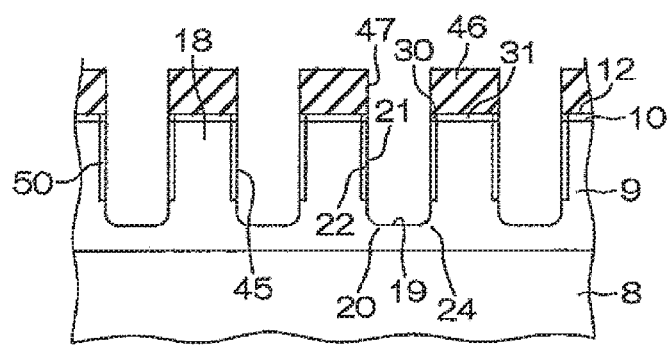
FIG. 18F is a view showing a next step of FIG. 18E.

Then, as shown in FIG. 18F, the hard mask 46 being used during the formation of the p-type layer 54 is kept, and through the hard mask 46, dry etching is performed on the SiC epitaxial layer 6 from the surface 12 to the depth that runs through a bottom portion of the p-type layer 54, thereby forming the strip-shaped U-shaped trenches 45. The remaining parts (side portions) of the p-type layer 54 are kept at the side walls of the U-shaped trench 45.

Figure 18G:
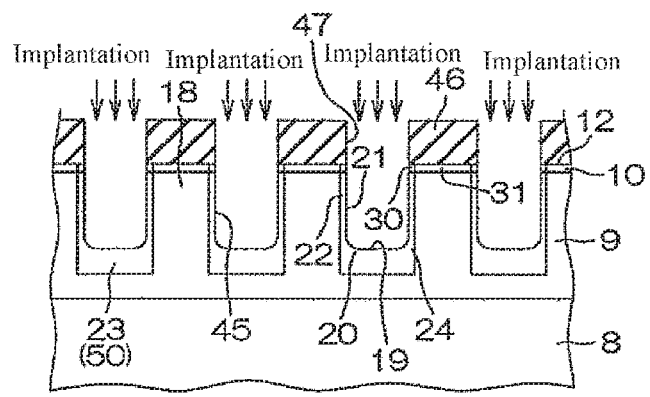
FIG. 18G is a view showing a next step of FIG. 18F.

Then, as shown in FIG. 18G, the hard mask 46 being used during the formation of the U-shaped trenches 45 is kept, and a p-type impurity (for example, Al) is implanted into the U-shaped trenches 45 through the hard mask 46. The dozing of the p-type impurity is achieved by using, for example, an ion implantation method, in which ions with the energy being 380 keV and the dose being $2\times10^{13}$ cm$^{-2}$ are implanted. After the dozing of the impurity, annealing treatment is performed at, for example, 1,700° C., so that the implanted impurity is mixed with the impurity of the p-type layer 54, thereby forming the p-type layer 23.

Therefore, the following steps are repeated, that is, the step of implanting ions into the surface 12 of the SiC epitaxial layer 6 to form the p-type layers 48, 54 to the specific depth from the surface 12, and the step of forming the trenches 53, 45 running through the bottom portions of the p-type layers 48, 54 and keeping the side portions of the p-type layers 48, 54 at the side walls of the trenches 53, 45, so that even if the side surfaces 21 of the U-shaped trench 45 are perpendicular to the bottom surface 19, the p-type layer 23 can be effectively formed on the side walls 22 of the U-shaped trench 45. Furthermore, the number of times to repeat the ion implantation and trench formation phases is not limited to two times, and can be three times or more.

Furthermore, the hard mask 46 being used when the p-type layers 48, 54 and the trenches 53, 45 are formed is used continuously to perform the ion implantation, so that when the p-type layer 23 is formed, the step of forming a mask is not required.

The embodiments of the present invention have been above illustrated, but the present invention can also be implemented in other manners.

For example, the semiconductor of the Schottky barrier diode 1 can have the structure of inversed conductivity types. For example, in the Schottky barrier diode 1, the p-type part can be n-type, and the n-type part can be p-type.

Furthermore, the epitaxial layer is not limited to the epitaxial layer including SiC, and can be a wide bandgap semiconductor other than SiC: for example, a semiconductor with the insulation breakdown electric field being greater than 2 MV/cm, specifically, GaN (the insulation breakdown electric field being about 3 MV/cm and the width of the bandgap being about 3.42 eV) and diamond (the insulation breakdown electric field being about 8 MV/cm and the width of the bandgap being about 5.47 eV).

Figure 19A:
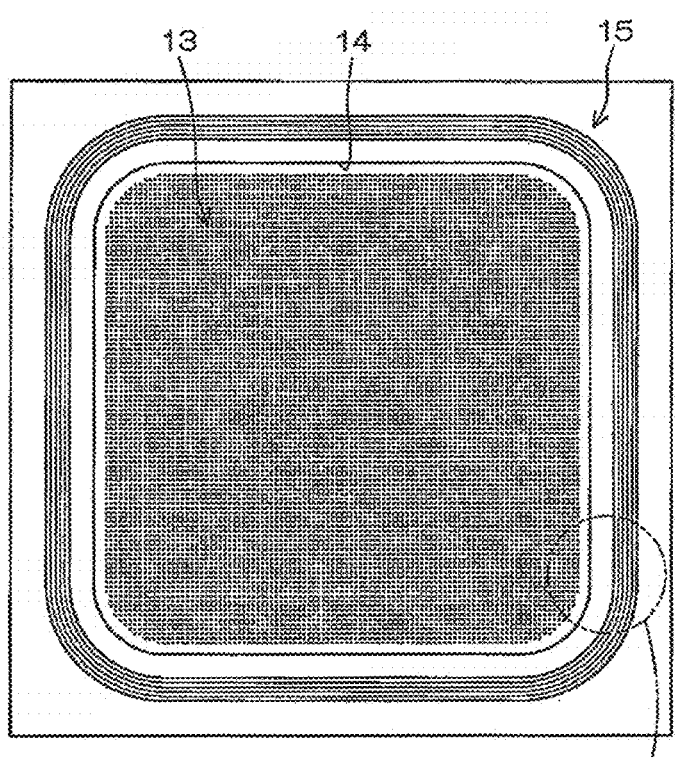
FIG. 19A is a view showing a variation of a planar shape of a trench.
Figure 19B:
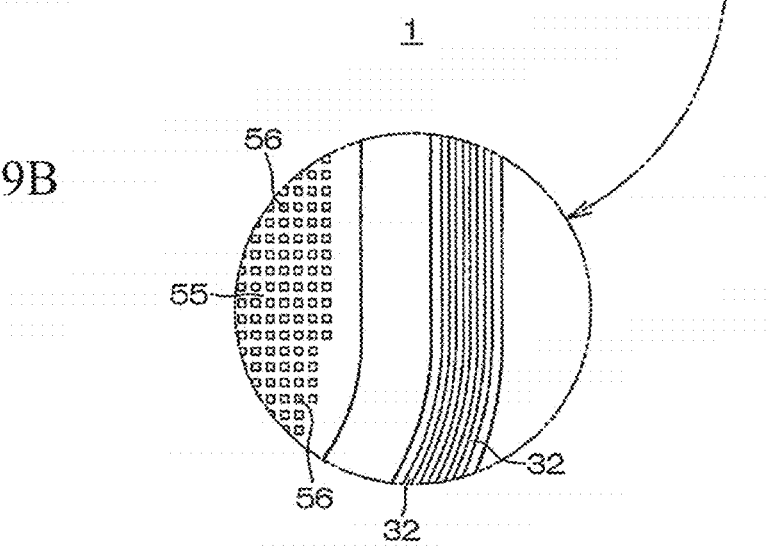
FIG. 19B is an illustrative view showing an enlarged part of FIG. 19(a)

The planar shape of the trench does not necessary need to be strip-shaped, and may be, for example, a lattice trench 55 as shown in FIG. 19A and FIG. 19B. In this case, a unit cell 56 is formed to be rectangular on each pane part of the lattice trench 55. Furthermore, the lattice trench 55 is preferably formed with the surface position of the side surfaces being the (11-20) face and the (1-100) face.

Furthermore, part or all of the inner surface (the bottom surface and the side surfaces) of the trench can be formed with an insulating film. For example, in FIG. 20 to FIG. 24, part or all of the side surfaces 21 and the bottom surfaces 19 of the trapezoidal trenches 17 are formed with insulating films 57 to 61 respectively.

Figure 20:
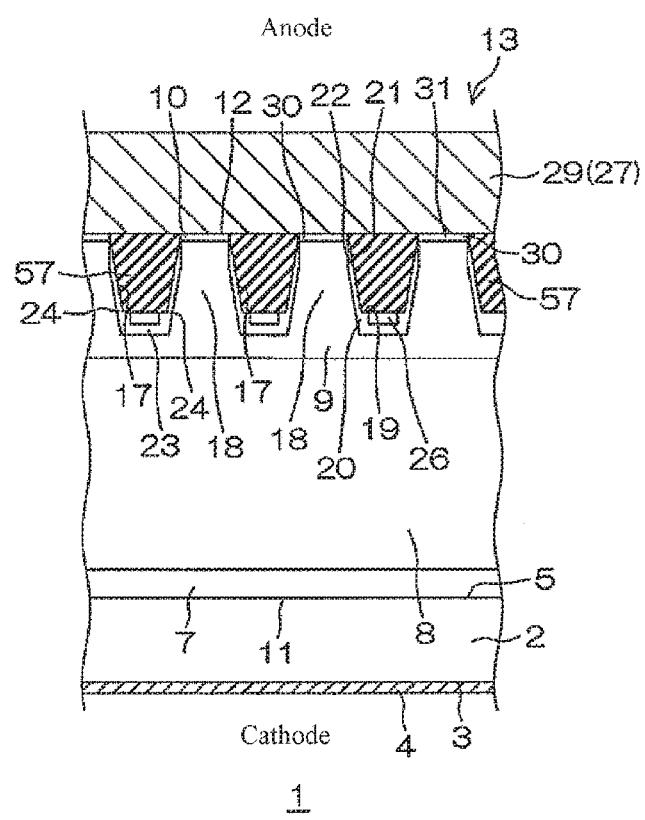
FIG. 20 is a view showing an example (a first form) in which an insulating film is formed on a surface of a trench.

Specifically, the insulating film 57 of FIG. 20 is filled from the bottom surface 19 of the trapezoidal trench 17 to the opening end of the trapezoidal trench 17, and is connected to the whole surface of the bottom surface 19 and the side surfaces 21, so that an upper surface of the insulating film 57 forms the same plane with the surface 12 of the SiC epitaxial layer 6.

Figure 21:
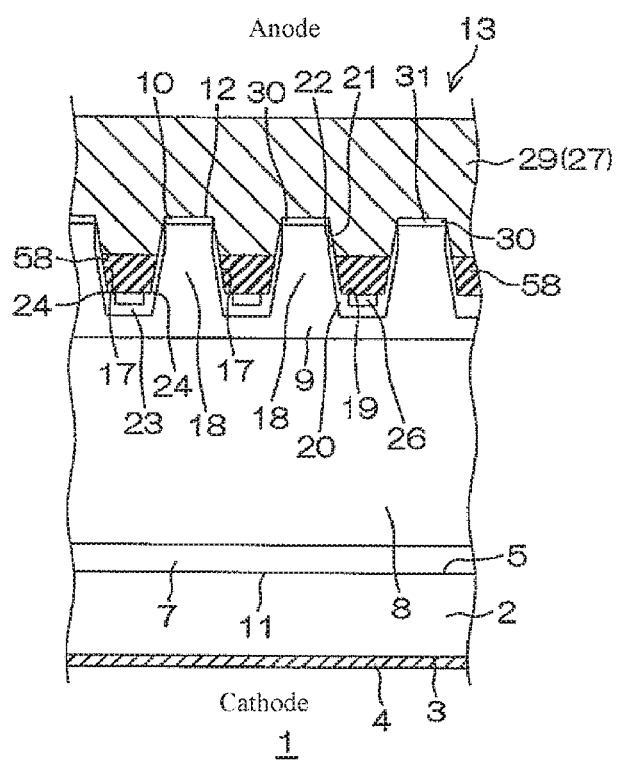
FIG. 21 is a view showing an example (a second form) in which an insulating film is formed on a surface of a trench.

The insulating film 58 of FIG. 21 is filled from the bottom surface 19 of the trapezoidal trench 17 to an intermediate portion of the depth direction of the trapezoidal trench 17, and is connected to the whole surface of the bottom surface 19 and a part of the side surfaces 21.

Figure 22:
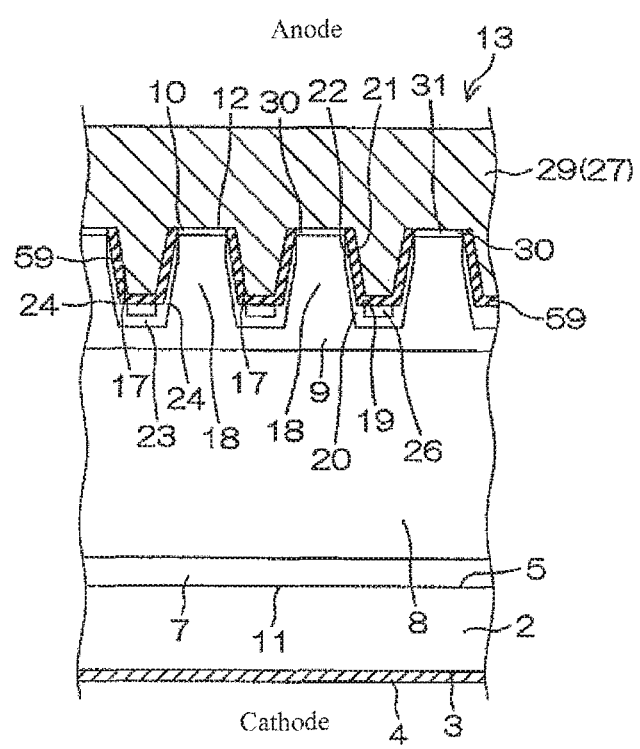
FIG. 22 is a view showing an example (a third form) in which an insulating film is formed on a surface of a trench.

The insulating film 59 of FIG. 22 is formed in the shape of a film from the bottom wall 20, passing the edge portions 24 to the opening end of the trapezoidal trench 17, so as to reserve a space inside the trapezoidal trench 17, and be connected to the whole surface of the bottom surface 19 and the side surfaces 21 of the trapezoidal trench 17.

Figure 23:
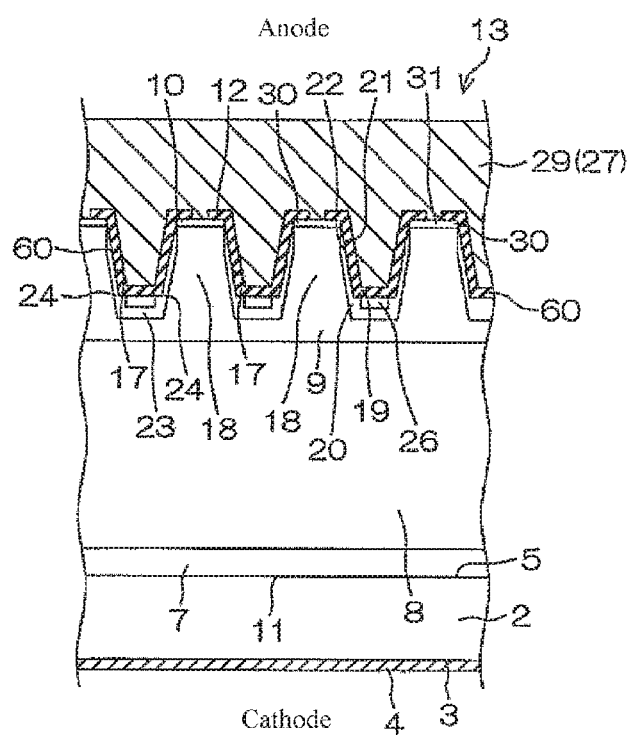
FIG. 23 is a view showing an example (a fourth form) in which an insulating film is formed on a surface of a trench.

The insulating film 60 of FIG. 23 is formed in the shape of a film from the bottom wall 20, passing the edge portions 24, and covering the peripheral portion 30 of the opening end of the trapezoidal trench 17 on the side of the surface 12, so as to reserve a space inside the trapezoidal trench 17, and be connected to the whole surface of the bottom surface 19 and the side surfaces 21 of the trapezoidal trench 17.

Figure 24:
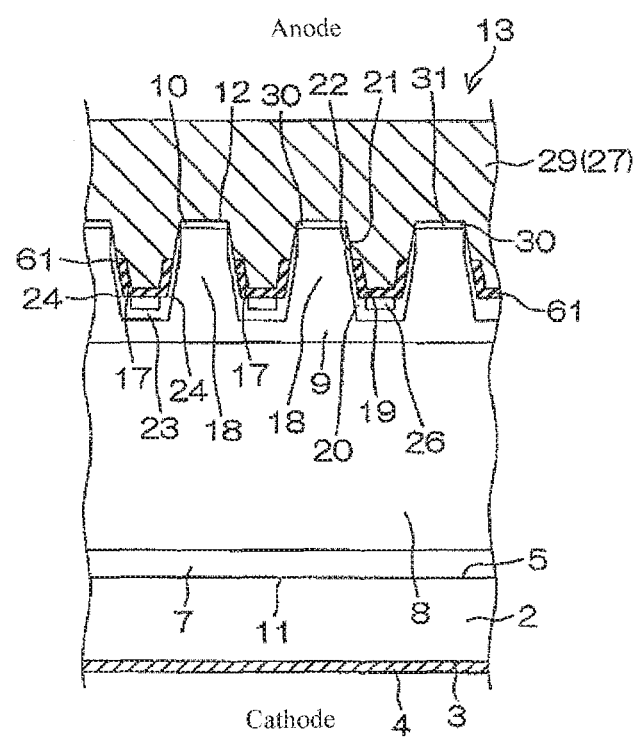
FIG. 24 is a view showing an example (a fifth form) in which an insulating film is formed on a surface of a trench.

The insulating film 61 of FIG. 24 is formed in the shape of a film from the bottom wall 20, passing the edge portions 24 to an intermediate portion of the depth direction of the side surfaces 21, so as to reserve a space inside the trapezoidal trench 17, and to be connected to the whole surface of the bottom surface 19 of the trapezoidal trench 17 and a part of the side surfaces 21.

Therefore, part or all of the side surfaces 21 and the bottom surface 19 of the trapezoidal trench 17 are formed with the insulating films 57 to 61, thereby increasing the speed of switching.

Figure 25:
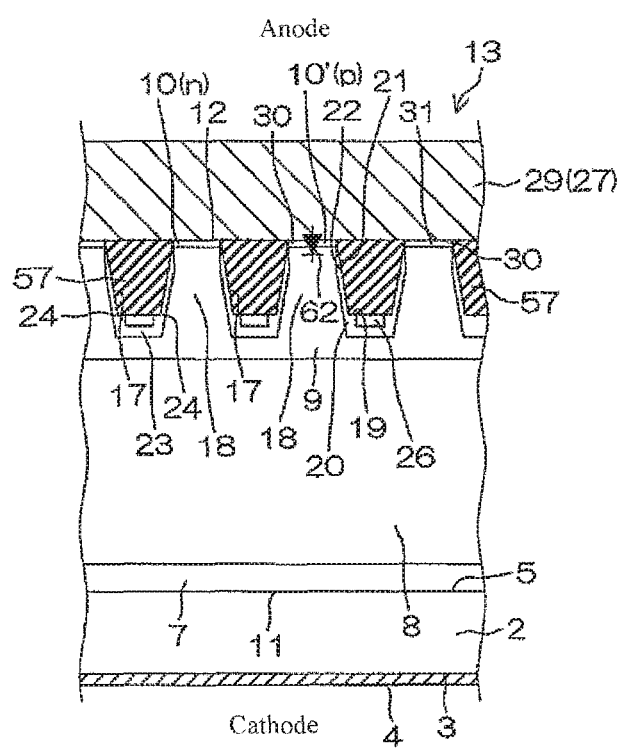
FIG. 25 is a view showing an example (a sixth form) in which an insulating film is formed on a surface of a trench.
Figure 26:
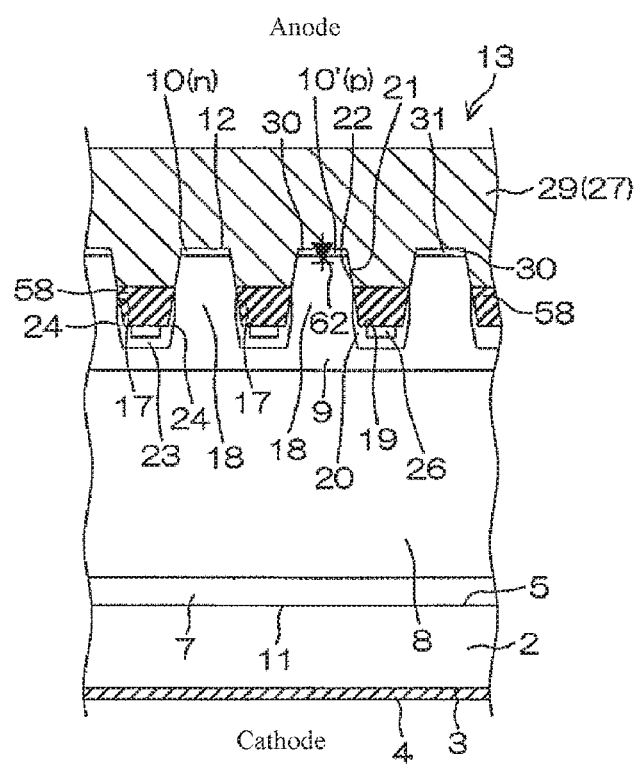
FIG. 26 is a view showing an example (a seventh form) in which an insulating film is formed on a surface of a trench.

Therefore, in an example of FIG. 25, a part of the n-type surface drift layer 10 is replaced by a p-type surface layer 10' which is changed into the p-type, and the anode electrode 27 is connected to the p-type surface layer 10', thereby disposing a pn diode 62 including the p-type surface layer 10' and the n-type SiC epitaxial layer 6 (the low-resistance drift layer 9). Therefore, the effect that is identical to that of the pn diode 25 as shown in FIG. 10 can be achieved. Furthermore, in an example as shown in FIG. 26, the formed p-type layer 23 only reaches the intermediate portion of the depth direction of the trapezoidal trench 17, and the p-type layer 23 is covered by the insulating film 58 to be hidden. In this case, as in FIG. 25, a part of the n-type surface drift layer 10 is replaced by a p-type surface layer 10' which is changed into the p-type, and the anode electrode 27 is connected to the p-type surface layer 10', thereby disposing the pn diode 62.

Furthermore, for the anode electrode, besides Al and polysilicon, molybdenum (Mo) and Titanium (Ti) can also be used, so as to perform the Schottky junction (heterogeneous junction) relative to the SiC epitaxial layer 6.

Furthermore, aluminum (Al) can be used as the p-type impurity for forming the p-type layer 23.

The semiconductor device (the semiconductor power device) of the present invention can be assembled in a power module used in a phase inverting circuit constructing a drive circuit for driving an electric motor. The electric motor is used as a power source in electric vehicles (including hybrid vehicles), trams, and industrial robots. The device can also be assembled in a power module used in a phase inverting circuit for performing conversion to match electricity generated by a solar cell, a wind turbine and other power generating devices (especially a household power generating device) with electricity from a commercial power supply.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. A semiconductor device, comprising:
   a first conductivity type semiconductor layer, comprising a wide bandgap semiconductor and including a surface, wherein a trench including a side wall and a bottom wall is formed in the surface; and the semiconductor layer comprises a second conductivity type electric field moderating part selectively formed on the bottom wall of the trench and the edge portions of the bottom wall; and
   a Schottky electrode connected to said surface of the semiconductor layer;
   wherein opposite edge portions of the bottom wall of the trench each include a radius of curvature, R, satisfying the expression (1) as set out below:

$$0.01\ L < R < 10\ L, \tag{1}$$

where L represents the straight-line distance in a width direction of the trench between the opposite edge portions; and
   the semiconductor layer includes a part that is different from the electric field moderating part, the part includes a first conductivity type first part for applying a first electric field and a first conductivity type second part for applying a second electric field that is stronger than the first electric field, when a reverse voltage is applied; and
   the Schottky electrode includes a first electrode forming a first Schottky barrier between the first electrode and the first part, and a second electrode forming a second Schottky barrier relatively higher than the first Schottky barrier between the second electrode and the second part.

2. The semiconductor device according to claim 1, wherein the electric field moderating part spans the edge portions of the bottom wall of the trench and the side wall of the trench.

3. The semiconductor device according to claim 2, wherein the electric field moderating part is formed to extend to an opening end of the trench along the side walls of the trench.

4. The semiconductor device according to claim 1, wherein the trench comprises a tapered trench, and the tapered trench includes the bottom wall with planar shape and the side walls inclined at an angle greater than 90° relative to the bottom wall with planar shape.

5. The semiconductor device according to claim 1, wherein
   the Schottky electrode fills the trench; and
   the electric field moderating part includes a contact portion at the bottom wall of the trench, and an ohmic junction is formed between the contact portion and the Schottky electrode filling the trench.

6. The semiconductor device according to claim 1, wherein the first part of the semiconductor layer is formed on a peripheral portion of the opening end of the trench on a surface layer portion of the semiconductor layer; and the second part of the semiconductor layer is formed on a part adjacent to the peripheral portion on the surface layer portion of the semiconductor layer.

7. The semiconductor device according to claim 1, wherein
   the semiconductor layer includes a base drift layer including a first impurity concentration, and a low-resistance drift layer formed on the base drift layer and including a second impurity concentration that is relatively higher than the first impurity concentration; and
   the trench is formed with a deepest portion of the trench reaching the low-resistance drift layer and separates a part of the semiconductor layer as an unit cell.

8. The semiconductor device according to claim 7, wherein the first impurity concentration of the base drift layer decreases along a direction from a back surface of the semiconductor layer to the surface of the semiconductor layer.

9. The semiconductor device according to claim 7, wherein the second impurity concentration of the low-resistance drift layer is fixed along a direction from a back surface of the semiconductor layer to the surface of the semiconductor layer having the trench formed therein.

10. The semiconductor device according to claim 7, wherein the second impurity concentration of the low-resistance drift layer decreases along a direction from a back surface of the semiconductor layer to the surface of the semiconductor layer having the trench formed therein.

11. The semiconductor device according to claim 7, wherein the semiconductor layer further comprises a surface drift layer formed on the low-resistance drift layer, and the surface drift layer includes a third impurity concentration that is lower than the second impurity concentration.

12. The semiconductor device according to claim 7, further comprising:
- a first conductivity type substrate, comprising a wide bandgap semiconductor and supporting the semiconductor layer;
- wherein the semiconductor layer further comprises a buffer layer formed on the substrate, and the buffer layer includes a fourth impurity concentration that is higher than the first impurity concentration.

13. The semiconductor device according to claim 1, wherein the trench comprises a strip trench formed with strip shape.

14. The semiconductor device according to claim 1, wherein the trench comprises a lattice trench of lattice shape.

15. The semiconductor device according to claim 1, wherein an insulation breakdown electric field of the wide bandgap semiconductor is greater than 1 MV/cm.

16. The semiconductor device according to claim 1, wherein the wide bandgap semiconductor is SiC, GaN, AlN or diamond.

* * * * *